United States Patent [19]
Komarek et al.

[11] Patent Number: 5,812,461
[45] Date of Patent: Sep. 22, 1998

[54] DRIVER CIRCUIT FOR ADDRESSING CORE MEMORY AND A METHOD FOR THE SAME

[75] Inventors: James A. Komarek, Newport Beach; Clarence W. Padgett, Westminster; Robert D. Amneus, Harbor City; Scott B. Tanner, Irvine, all of Calif.

[73] Assignee: Creative Integrated Systems, Inc., Santa Ana, Calif.

[21] Appl. No.: 741,207

[22] Filed: Oct. 29, 1996

Related U.S. Application Data

[63] Continuation-in-part of Ser. No. 16,811, Feb. 11, 1993, Pat. No. 5,459,693, and a division of Ser. No. 487,841, Jun. 7, 1995, Pat. No. 5,594,696, which is a continuation-in-part of Ser. No. 912,112, Jul. 19, 1992, Pat. No. 5,241,497, which is a continuation of Ser. No. 538,185, Jun. 14, 1990, abandoned.

[51] Int. Cl.$^6$ .............................. G11C 7/00; H03K 19/00
[52] U.S. Cl. ......................... 365/189.05; 326/58; 326/83
[58] Field of Search ......................... 365/189.02, 189.05; 326/58, 82, 83; 327/108, 109, 111; 368/185.16

[56] References Cited

U.S. PATENT DOCUMENTS

| | | | |
|---|---|---|---|
| 5,146,111 | 9/1992 | Ciraula | 326/58 |
| 5,165,046 | 11/1992 | Hesson | 326/58 |
| 5,436,577 | 7/1995 | Lee | 326/58 |

*Primary Examiner*—David C. Nelms
*Assistant Examiner*—Son Mai
*Attorney, Agent, or Firm*—Daniel L. Dawes

[57] ABSTRACT

The invention is an improved bank select read only memory in which the bit lines and virtual ground lines are precharged to ground instead of being precharged to an internal low supply voltage. Both of the two virtual ground lines are selected for the selected bit and both selected virtual ground lines are driven to ground during the precharge phase. At the top of the memory array, all virtual ground lines in the memory array are precharged to ground during the precharge phase. Next, during the sensing phase, the operation of the two virtual ground lines for the selected bit is changed to selectively hold one virtual ground line at ground and switch the second virtual ground line to a positive voltage. All bit lines are precharged to ground during the precharge phase. In the following sensing phase, the selected bit line is driven positive by the selected memory core FET if it is programmed with a low threshold voltage. If the selected memory core FET is programmed with a high threshold voltage, the bit line remains floating at the ground level, or it may be held at ground by means of the second virtual ground line, which is held at ground, and by low threshold core FETs, adjacent to the selected core FET, which are connected to the selected word line. The total diffusion capacitance on a virtual ground line is minimized when the memory cells connected to the line are programmed with more logic zeros than logic ones.

9 Claims, 12 Drawing Sheets

Fig. 4

LOGIC ZERO MAXIMUM VOLTAGE
MAIN BIT LINE
GROUNDED CORE

|   | CORE FETS ON WL1 | | | | MAXIMUM VOLTAGE |
|---|---|---|---|---|---|
|   | 22(2) | 22(1) | 22(3) | 22(4) | MAIN BIT LINE 12 |
| 1 | C | IC | IC | IC | VGL1 |
| 2 | C | IC | IC | C | VGL1 |
| 3 | C | IC | C | IC | 0.46 VGL1 |
| 4 | C | IC | C | C | 0.38 VGL1 |
| 5 | C | C | IC | IC | VGL1 |
| 6 | C | C | IC | C | VGL1 |
| 7 | C | C | C | IC | 0.53 VGL1 |
| 8 | C | C | C | C | 0.46 VGL1 |

C: LOW THRESHOLD VOLTAGE
IC: HIGH THRESHOLD VOLTAGE
VGL1: VIRTUAL GROUND LINE 1 VOLTAGE = 2 VOLT
VGL2: VIRTUAL GROUND LINE 2 VOLTAGE = GROUND

DRIVER CIRCUIT FOR ADDRESSING CORE MEMORY AND A METHOD FOR THE SAME

RELATED APPLICATIONS

This is a divisional of application Ser. No. 08/487,841 filed on Jun. 7, 1995, U.S. Pat. No. 5,594,696, which is a continuation in part of application Ser. No. 07/912,112 entitled VLSI Memory with Increased Memory Access Speed, Increased Memory Cell Density and Decreased Parasitic Capacitance, filed on Jul. 9, 1992, which issued as U.S. Pat. No. 5,241,497, and which in turn is a file wrapper continuation of application Ser. No. 07/538,185 filed on Jun. 14, 1990, and now abandoned. This application is also a continuation in part of application Ser. No. 08/016,811, entitled Improvements in a Very Large Scale Integrated Planar Read Only Memory, filed on Feb. 11, 1993, which issued as U.S. Pat. No. 5,459,693. Each of the foregoing referenced parent applications are explicitly incorporated herein by reference.

BACKGROUND OF THE INVENTION

1. Field of the Invention

The invention relates to the field of semiconductor memories and in particular to memory cores for read only memories (ROM, EPROM) or flash memories (EEPROM). Specifically, the invention relates to improvements in a method of precharging a memory core, sensing of the data lines in a memory core, and address decoding of the memory core.

2. Description of the Prior Art

Grounded Memory Core Design and Methodology

Architectures for very large scale integrated (VLSI) ROMs using virtual ground lines and diffusion bits lines to access banks of core cells are well known Descriptions of such architectures can be found in Okada, et.al. "18 Mb ROM Design Using Bank Select Architecture," Integrated Circuits Group, Sharp Corp. However, such architectures are subject to several limitations and drawbacks as a discussed in the parent applications of this application and as are implicitly further detailed in the brief summary below wherein the improvements of the invention of the prior art and over the art of the parent application are explained.

Differential Sense Amplifier

Although not prior art, the parent application shows a sense amplifier approach using a current mirror. A schematic drawing of this previous sense amplifier is presented in FIG. 21 of the parent, which is reproduced here as FIG. 5, since many of the improvements of the invention are best understood in comparison to the design in the parent application.

Both approaches use the same clocking signals and have the same timing. Also, both approaches amplify voltage differences of about 0.15 volts. The previous design amplifies voltages that are close to 2.0 volts with differences of about 0.15 volts.

The current mirror approach used in the previous design loads the differential amplifier output nodes with an unbalanced capacitive load. This unbalanced load favors one side of the latch over the other side of the latch. It would be possible to add capacitance to the previous design to balanced the nodes, but extra capacitance slows the latch and reduces the transient response of the latch.

Because of the small difference in voltages being sensed, small imbalances in the previous design of the differential amplifier may have a large enough effect to cause the differential amplifier to fall into the wrong state.

Virtual Ground and Bit Line Decoder

A design for a virtual ground and bit line decoder is described in the copending parent application in connection with FIGS. 18–20 (N387). Another design for a virtual ground and bit line decoder is shown in copending application N051-D in connection with FIGS. 1–2.

A previous interlock method was used in the CMOS 4 Megabyte ROM circuit. A schematic diagram of a previous interlock method is presented in FIG. 8.

The designs in the parent application both show approaches to decoding virtual ground lines and bit lines in a ROM. These previous decoder circuits are similar to the present decoder circuit, but the methods of decoding are different as will be described below.

The interlock method shown in FIG. 8 is an example of a previous interlock method. The present interlock method is an improvement of this design.

BRIEF SUMMARY OF THE INVENTION

Grounded Memory Core Design and Methodology

The memory core design of the invention is diagrammatically shown in the chip layout depiction of FIG. 1 and in the corresponding schematic of FIG. 2. The operation of the bit lines and virtual ground lines of the circuit of the invention as shown in FIGS. 1 and 2 is very different from that described in the copending parent of this application. The operation of the polysilicon word lines, WL1–WLn, or the polysilicon select lines BS, CA, and CB are the same as described in the parent, which is expressly incorporated herein by reference, and therefore will not be described in a detail greater than necessary to provide contextual support in this specification.

There are at least five separate improvements in operation for the invention. First, the bit lines and virtual ground lines are all precharged to ground instead of being precharged to an internal low supply voltage of about 2 volts. In the parent application, the internal low voltage supply or precharge voltage is referred to as VPC. The VPC voltage is not required for the invention.

Second, the operation of the virtual ground lines in the parent was to first precharge all virtual ground lines to VPC, then select one of the two virtual ground lines for the selected bit and switch it from VPC to ground.. The second virtual ground line for the selected bit remained floating at the VPC voltage level.

In the invention, both of the two virtual ground lines are selected for the selected bit and both selected virtual ground lines are driven to ground during the precharge phase. At the top of the memory array, all virtual ground lines in the memory array are precharged to ground during the precharge phase. Next, during the sensing phase, the operation of the two virtual ground lines for the selected bit is changed to selectively hold one virtual ground line at ground and switch the second virtual ground line to a positive voltage. This is accomplished by means of a modified virtual ground line decoder and driver which are new with the invention.

Third, the operation of the bit lines in the prior art is to precharge all bit lines to VPC, and the then the selected bit line is discharged toward ground if the selected memory core FET is programmed with a low threshold voltage. If the selected memory core FET is programmed with a high threshold voltage, the bit line remains floating at the VPC voltage level.

In the invention, all bit lines are precharged to ground during the precharge phase. In the following sensing phase, the selected bit line is driven positive by the selected memory core FET if it is programmed with a low threshold voltage. If the selected memory core FET is programmed with a high threshold voltage, the bit line remains floating at the ground level, or it may be held at ground by means of the second virtual ground line, which is held at ground, and low threshold core FETs, adjacent to the selected core FET, which are connected to the selected word line.

Fourth, a core FET programmed with a low threshold voltage is used to define a logic zero at the ROM output, and a core FET programmed with a high threshold voltage is used to define a logic one at the ROM output. By these definitions, the total diffusion capacitance on a virtual ground line is minimized when the memory cells connected to the line are programmed with more logic zeros than logic ones. The definitions take advantage of the fact that a core FET programmed with a low threshold voltage, a logic zero, has a significantly lower diffusion junction capacitance. Also, the definitions take advantage of the fact that unused code space in a ROM code pattern is usually filled with logic zeros, and that some ROM code patterns, like a font code for generating alphanumeric characters, have more logic zeros than logic ones in the total code pattern.

Fifth, the memory core as illustrated in FIG. 2 is not the only core circuit which can be used in the grounded core operating mode defined by the current invention. Other memory core designs which are compatible with the following circuit functions can be used, such as:

1) a voltage sensing or current sense amplifier;
2) a virtual ground line decoder circuit which selects both virtual ground lines VGL1 and VGL2 associated with the selected main bit line bit line;
3) a virtual ground line driver circuit to drive both of the two selected metal virtual ground lines, and if a precharge phase is used, both of the two selected metal virtual ground lines are driven to precharge ground level, then, during the sensing phase, one of the two metal virtual ground lines is held at ground and the other of the two metal virtual ground lines is switched to a voltage source; and
4) If a precharge phase is used, a precharge circuit is used to drive all metal virtual ground lines and metal bit lines to ground during the precharge phase. During the sensing phase, the precharge circuit is turned off.

Changing the operation of the memory core from the protocol described in the above referenced parent application to that of the invention provides significant advantages. First, the low voltage supply, VPC, is eliminated. Some ROMS, having 8 megabits or more, may have a standby current specification of 100 microamperes maximum from the VDD supply voltage. Prior art technology of maintaining an 8 megabit memory core at the VPC voltage during standby is impractical due to the junction leakage current drawn by the memory core arrays in the ROM.

Using a memory core precharged to ground eliminates VPC and resolves the standby junction leakage current problem. Using a memory core without a precharge phase and with current sensing as defined by the invention eliminates VPC and resolves the standby junction leakage current problem.

Second, in the invention the selected bit line is driven positive by the selected memory core FET if it is programmed with a low threshold voltage. The current from the selected core FET supplies the current to charge the bit line capacitance. It also supplies the selected memory core sector junction leakage current and supplies charge to compensate for negative noise voltage capacitively coupled to the bit line from the core precharge clocks turning off.

In the designs described in the parent application referenced above, the bit line may remain floating at the VPC voltage level during the core sensing time, if the selected core FET is programmed with a high threshold voltage. To supply the selected memory core sector junction leakage current, and to supply charge to compensate for negative noise capacitively coupled to the bit line, a circuit, such as the one shown in FIG. 4 of the parent application is necessary.

This type of circuit is not needed in the invention. Elimination of this circuit provides a significant improvement in the sensing performance of the invention. The circuit provides a small pull-up current to the selected bit line to compensate for both negative capacitively coupled noise and core junction leakage to the grounded memory substrate. When a selected memory cell switches the bit line toward ground, the memory cell must also switch the small pull-up current to ground. The "bit-low" switching time and voltage level is achieved more easily in the invention than in prior types of designs for ROMS using this type of circuit.

Third, a ROM utilizing the invention can operate with a VDD supply voltage of 3 volts because the memory core is precharged to ground. Prior designs of ROMS with a memory core precharged to a low supply voltage, such as VPC which is about 2 volts, require an operating VDD supply voltage more than 1.5 volts greater than VPC for operation of the precharge clocks, polysilicon word lines, and polysilicon sector select lines in the memory core.

Fourth, a ROM utilizing the current invention can precharge the memory core to ground, the precharge voltage level, in significantly less time than required for ROMS with the memory core precharged to a low supply voltage, such as VPC, which is about 2 volts. The current invention utilizes an NFET with a grounded source for switching the memory core virtual ground lines and main bit lines to ground. This NFET has the full VDD voltage applied from the gate terminal to the source terminal during the entire precharge time. The prior designs utilize an NFET in a source follower configuration for switching the memory core virtual ground lines and main bit lines to a low voltage such as VPC. With this configuration, the voltage applied from the gate terminal to the source terminal, which is connected to VPC, decreases during the precharge time. This increases the required precharge time, and requires an operating VDD supply voltage more than 1.5 volts greater than VPC for minimizing the precharge time to VPC.

The invention is an improvement in a memory having a memory core with a plurality of memory cells and a predetermined memory core substrate voltage. The memory cells are accessed at least in part by selection of corresponding bit lines and virtual ground lines coupled thereto. The improvement comprises precharging circuitry for precharging the virtual ground lines and bit lines in the memory core to the memory core substrate voltage. Virtual ground line and bit line decoder and precharging circuitry precharges previously selected virtual ground lines and bit lines in the memory core to ground. Virtual ground line driver circuitry first drives both selected virtual ground lines to ground during a precharge phase and then selectively drives one virtual ground line to ground and the second virtual ground line to a positive voltage level. Memory core junction leakage current from the virtual ground lines and bit lines in the memory core is reduced to zero when the memory core is precharged to the memory core substrate voltage. The need for an internal low voltage supply for a precharge level is eliminated. VDD standby current and operating voltage level required for the memory is significantly reduced.

The time required to precharge the memory core to the precharged voltage level at the beginning of a memory read cycle is significantly reduced. The precharging circuitry, virtual ground line and bit line decoder and precharging circuitry, virtual ground line driver circuitry and the memory core provide the main bit line with bit-low level and bit-high level voltages which are negligibly affected by capacitively coupled negative noise voltages or by memory core junction leakage currents to the memory core substrate. The precharging circuitry, virtual ground line and bit line decoder and precharging circuitry, virtual ground line driver circuitry, and the memory core provide a positive current to the main bit line for providing a positive voltage defined as a logic zero level or bit-high level and a precharged zero voltage level to the main bit line for a logic one or bit-low level.

The improvement further comprises bit line voltage sensing circuitry to sense bit-low level and bit-high level voltages on the main bit line at high speed with a bit-high voltage level of at least 150 millivolts and with a bit-low level of approximately zero volts.

Each memory cell comprises a core FET. The core FET of at least one of the memory cells is programmed with a low threshold voltage defining a logic zero output. The precharging circuitry, virtual ground line and bit line decoder and precharging circuitry, virtual ground line driver circuitry, and the memory core for minimizing total diffusion capacitance on the virtual ground line coupled to the memory cells when the memory cells are programmed with more logic zeros than logic ones, and for reducing capacitance associated with the core FET programmed with a low threshold voltage due to minimized total diffusion capacitance.

The virtual ground line and bit line decoder and precharging circuitry precharges previously selected virtual ground lines and bit lines in the memory core to approximately zero voltage.

The invention is also an improvement in a method of operation of a memory having a memory core with a plurality of memory cells and a predetermined memory core substrate voltage. The memory cells are accessed at least in part by selection of corresponding bit lines and two associated virtual ground lines coupled thereto from a plurality of bit lines and associated virtual ground lines in the memory. The improvement comprises the steps of precharging the virtual ground lines and bit lines in the memory core to the memory core substrate voltage. A pair of the virtual ground lines is selected in the memory. Both selected virtual ground lines are driven to ground during a precharge phase. One of the selected virtual ground line is selectively driven to ground and the other one of the selected virtual ground line to a positive voltage level.

Differential Sense Amplifier

The parent application shows a similar sense amplifier approach using a current mirror instead of a cross coupled current source. A schematic drawing of this previous sense amplifier is presented in FIG. 21 of the parent, which is reproduced here as FIG. 5, since many of the improvements of the invention are best understood in comparison to the design in the parent application.

Both approaches use the same clocking signals and have the same timing. Also, both approaches amplify voltage differences of about 0.15 volts. The previous design amplifies voltages that are close to 2.0 volts with differences of about 0.15 volts. The present design amplifies voltages that are close to ground with differences of about 0.15 volts. The use of voltage level shifters, a cross coupled current source and inverters is unique to the present design.

The present sense amplifier design amplifies voltage differences of signals that are about 0.15 volts. The previous sense amplifier design amplifies voltage differences of signals that are about 2.0 volts.

The idea of using a cross coupled current source instead of a current mirror is not limited to the present design. This idea will work equally well in the previous sense amplifier and may be used without the voltage level shifting circuitry.

The current mirror approach used in the previous design loads the differential amplifier output nodes with an unbalanced capacitive load. This unbalanced load favors one side of the latch over the other side of the latch. The cross coupled current source approach loads the differential amplifier with a balanced load. It would be possible to add capacitance to the previous design to balanced the nodes, but extra capacitance would slow the latch and reduce the transient response of the latch.

The voltage level shifters in the present design are important because they allow the differential amplifier to sense signals that are close to ground with a voltage difference of about 0.15 volts. The voltage level shifters also shift the signals to a voltage that increases the gain of the differential amplifier. In the previous design, the differential amplifier was limited to amplifying signals that were at the internal precharge voltage of the memory core, i.e. about 2.0 volts. By level shifting inputs to the differential amplifier from zero volts to about 2.2 volts, the differences of these level shifted signals can now be amplified with a conventional differential amplifier.

It is important to note that the use of level shifters is not limited to only sense amplifiers. FIG. 7 shows a timing circuit that employs voltage level shifting circuits and a differential amplifier.

It is very desirable to have a symmetric design in a differential amplifier.

The cross coupled current source approach is symmetric while the current mirror approach is not. Because of the small difference in voltages being sensed, small imbalances in the differential amplifier may have a large enough effect to cause the differential amplifier to fall into the wrong state. The idea of using symmetry to improve the balance of the sense amplifier extends beyond the design to the layout of the design. A symmetric and balanced layout may sense smaller voltage differences and operate faster than would otherwise be possible.

The cross coupled current source approach can provide more gain than the current mirror approach. The gain of the cross coupled current source is controlled by four FETs.

The present design uses two inverters to block half level signals from being outputted until the sense amplifier data has been latched. By blocking half level outputs of the differential amplifier, a race condition is eliminated and output enable signal, OE may switch sooner than would otherwise be possible.

The invention is an improvement in a detection circuit having an input signal which is sensed. The improvement comprises a level shifting circuit for receiving the input signal and for shifting the voltage of the input signal to a predetermined level to output a voltage shifted level of the input signal. The predetermined level is within an operative range of detection of the detection circuit.

The input signal sensed by the level shifting circuit has a voltage close to ground. The detection circuit in the operative range is capable of distinguishing signal level differences at least as small as about 0.15 volts so that input signals at least as little as about 0.15 volts above ground are reliably sensed.

The level shifting circuit shifts the voltage of the input signal to the predetermined level within a wide range of selected voltages including the operative range of the detection circuit. The predetermined level is where the detection circuit has the most gain, speed and accuracy.

The detection circuit comprises a differential amplifier having two differential outputs and the detection circuit comprises a pair of cross coupled current sources to provide matched current sources to the differential amplifier. The pair of current sources are symmetric, balanced, have the same capacitive loading and the same impedance. The pair of cross coupled current sources initially provide two equal current sources, but become unmatched based on the output of the differential amplifier. The differential amplifier includes circuitry for providing positive feedback from the outputs to the pair of current sources to increase the gain and speed of the differential amplifier.

The pair of current sources have two cross coupled FETs and the gain of the cross coupled current source is controlled primarily by the two cross coupled FETs. A range of gains is provided to the differential amplifier by varying the width-to-length ratio of the two cross coupled FETs. The pair of current sources further comprise two FETs connected in parallel to the cross coupled FETs. The gain of the differential amplifier also is further controlled by varying the width-to-length ratio of the two parallel coupled FETs.

The improvement further comprises two inverters to block half-level outputs of the differential amplifier until both outputs of the detection circuit have been latched.

The invention is also an improvement in a method of detecting an input signal level the improvement comprising the steps of receiving the input signal, and shifting the voltage of the input signal to a voltage shifted output level. The voltage shifted output level is within an predetermined operative range of detection of a detection circuit. The voltage shifted output level is detected to distinguish the signal level of the input signal level.

Virtual Ground and Bit Line Decoder

The design described in the copending application, M387-D for the virtual ground and bit line decoder, and the present virtual ground and bit line decoder both multiplex a selected main bit line, mBL. The previous NMOS ROM decoder selects one virtual ground line and drives this line to ground. All other virtual ground lines are precharged to an internal low supply voltage of about 2 volts. The present design selects two virtual ground lines. These two lines are initially driven low. During the read cycle, one of the lines is driven high and the other line remains driven low. The virtual ground line that is driven high is determined by an address, AY[4].

Like the NMOS decoder described in copending application Ser. No. 08/016,811, entitled Improvements in a Very Large Scale Integrated Planar Read Only Memory, the CMOS virtual ground and bit line decoder multiplexes a selected main bit line and one virtual ground line. The CMOS decoder provides a better precharge than the NMOS decoder. In the CMOS design, PC0 is an input to the addresses YDL[0–7] and YDU[0–7]. When PC0 is high during core precharge, all the addresses YDL[0–7] and YDU[0–7] are high, all FETs in the decode are turned on, and all the virtual ground line and bit lines are precharged. This additional precharging technique is not used in the present design although this technique is compatible with the present design.

In comparison to the prior designs, the improved interlock method provides the same function with fewer gates. This method is inherently faster and uses less silicon die area because fewer gates are used.

In comparison to the previous NMOS ROM patent and the CMOS virtual ground and bit line decoder, the present decoder is designed for use with a memory core that is precharged to ground. The previous decoder was designed for use with a memory core that is precharged to a low voltage of about 2 volts. In the present design an additional decode is done by means of the SELV lines. Because this additional decode is done by means of the SELV lines, the present decoder uses fewer FETs and less area than would otherwise be possible.

Crowbar currents may be very large in inverters and logic gates with large FETs. When CMOS inverters and logic gates switch, there is a period of time where both the PMOS and the NMOS FETs are partially turned on. The current that flows through these FETs is called a "crowbar current". Crowbar current is normally not significant but can become very significant when large FETs are used. This interlock method avoids these crowbar currents.

The invention is an improvement in a method for decoding a plurality of virtual ground lines and bit lines in a memory comprising the steps of driving all virtual ground lines in the memory core low. Two virtual ground lines in a memory core are multiplexed by holding a selected first virtual ground line low and keeping a selected second virtual ground line low for memory core discharge, and by driving the selected second virtual ground line high for core evaluation. The core is then read or evaluated. All unselected virtual ground lines are kept floating during the step of evaluating the core. The second virtual ground line is then switched low for memory core discharge in preparation for subsequent core evaluation.

The improvement further comprising the step of precharging a BIT line to ground prior to the step of evaluating the core. The BIT line is selectively coupled to the bit lines in the memory.

The invention is also a decoder for producing two memory multiplexing signals, SELV0 and SELV1, capable of driving a large capacitive memory load. The decoder comprises decode circuitry for selectively decoding an address signal to drive one of the two memory multiplexing signals, SELV0 and SELV1, high and the other low. Drive circuitry generates the two memory multiplexing signals, SELV0 and SELV1, in response to the decode circuitry. The drive circuitry is tristated.

The drive circuitry is comprised of a pair of two large FETs coupled in series. The memory multiplexing signals, SELV0 and SELV1, are derived respectively from the coupling between one of the pair of the two large FETs. The drive circuitry comprises circuitry for turning each one of the two large FETs off before turning on the other one of the two large FETs in each of the pairs of FETs, so that one of the FETs of each pair will always be off when the other one of the pair of FETs is on.

The memory multiplexing signals, SELV0 and SELV1, have a voltage level set by a decoder supply voltage, VSEL. The memory multiplexing signals, SELV0 and SELV1, have the highest voltage level in the memory core. Voltage levels of the memory multiplexing signals, SELV0 and SELV1, are set at a level low enough to avoid memory breakdowns in the memory core.

The invention is also an improved method of precharging a memory core having a plurality of virtual ground lines and main bit lines comprising the steps of precharging all of the virtual ground lines and main bit lines in the memory core to ground before the core is read through a precharge block Two selected virtual ground lines are driven to ground before the core is read through precharge paths through the memory core independent of the precharge block.

The invention is still further a driver circuit for avoiding crowbar currents comprising two large FETs coupled in series. An output signal is derived from the coupling between the two large FETs. Circuitry is provided to turn each one of the two large FETs off before turning on the other one of the two large FETs, so that one of the FETs will always be off when the other one of the FETs is on.

The invention can be better visualized by turning to the following drawings, wherein like elements are referenced by like numerals.

BRIEF DESCRIPTION OF THE DRAWINGS

FIG. 4 is a table of main bit line voltage values depending on the programmed states of memory cells in a row coupled to the main bit line.

The various embodiments of the invention can now be understood by turning to the following detailed description.

DETAILED DESCRIPTION OF THE PREFERRED EMBODIMENTS

Grounded Memory Core Design and Methodology

Figure 2:
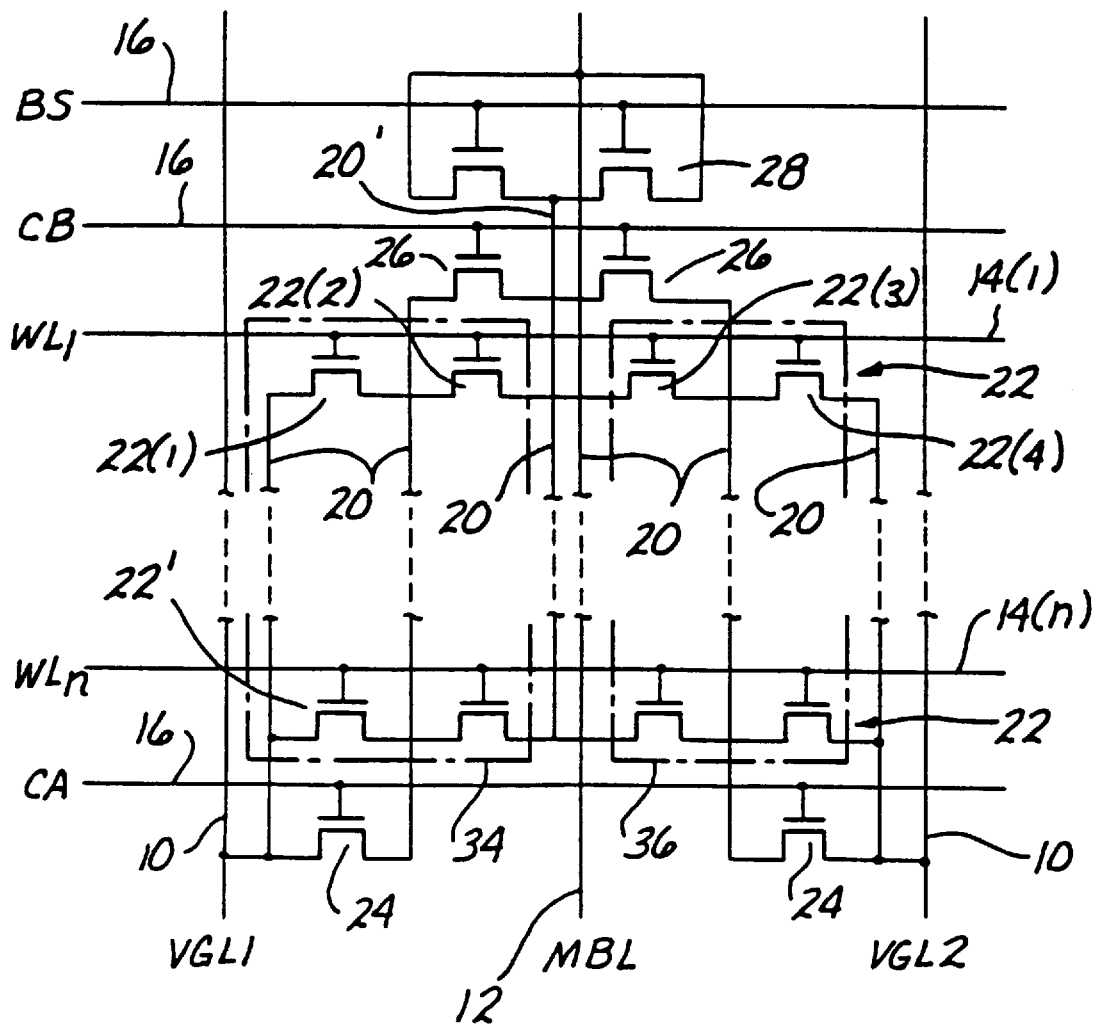
FIG. 2 is a schematic of the memory core shown in FIG. 1.

Consider now in detail the operation of the invention in a memory core schematically shown in FIG. 2, and with the use of a voltage sensing sense amplifier circuit, modified virtual ground line decoder and driver which are described below. The invention incorporates a memory circuit having an array of addressable memory cells organized into blocks of memory cells. One block of cells is shown in FIG. 2. A block is a segment of the core which is repeated in rows and columns to form the memory array. In the invention, a block is defined as shown in FIG. 2. There are four columns of memory cells in a block. The word lines, CA, CB, and BS select one cell in the block to be connected to the metal bit line, or main bit line. A sector of memory is defined as a row of blocks placed across the memory core or array which have common word lines and BS, CA, and CB lines. The sector is repeated in n rows to form the complete memory core or memory array. A ROM can be partitioned into one or more memory cores.

CA, Column Select A, is a polysilicon line extending across the full width of a sector. It is the gate terminal of core FETs which connect specific diffusion bit lines in the block to each other. CB, Column Select B, is a polysilicon line extending across the full width of a sector. It is the gate terminal of core FETs which connect specific diffusion bit lines in the block to each other. BL is a diffusion line in the block, or sector, which is the drain or source terminal for four columns of core FETs and four column select FETs controlled by CA or CB. The bit line signal from one of the sectors in the memory array is coupled to a metal bit line by block select BS. BL may refer to the diffusion or metal line. The metal bit line may be referred to as mBL, or main bit line.

WL, Word Line, is a polysilicon line extending across the full width of a sector. It is the gate terminal of one row of programmable core FETs in the sector. BS, Block Select, is sometimes defined as Bank Select and is a polysilicon line extending across the full width of a sector. It is the gate terminal of the core FETs which connect a diffusion bit line in a block to the metal bit line, or main bit line mBL.

VGL, Virtual Ground Line, is a diffusion bit line in the block of memory cells shown in FIG. 2. There are two diffusion bit lines which connect to the drain or source terminals for two columns of core FETs and for two column select FETs controlled by CA. Each of the two diffusion lines is connected to one of two metal buses which are also connected to corresponding diffusion lines in each block within a column of blocks in the memory array. Each of these two metal lines is defined as a virtual ground line.

The array of cells includes a plurality of metal virtual ground lines 10, main bit lines 12, polysilicon word lines 14(1)–(n), and polysilicon select lines 16. Each of polysilicon word lines 14(i), and polysilicon select lines 16 extend through each row of blocks of memory cells, or sector. Each of metal virtual ground lines 10 and main bit lines 12 extend through each column of blocks of memory cells. The metal lines run straight as, shown in FIG. 1, for an optimum layout design. The design comprises of a plurality of contacts 18 connecting metal virtual ground lines 10 and main bit lines 12 to corresponding ones of contacts 18 at each the end of each the blocks.

A decoder circuit selects a column of the blocks and couples a virtual ground line driver to the selected pair of metal virtual ground lines 10 and a sense amplifier to a main bit line 12 in the selected column of blocks. During the precharge phase, these circuits drive both of the two selected metal virtual ground lines 10 to ground, then, during the sensing phase, one of two metal virtual ground lines 10 is held at ground and the other of the two metal virtual ground lines is switched to a voltage source.

Each block has a first and a second end. The virtual ground line contacts 18 are disposed solely at one end of the block with main bit line contact 18 disposed solely at the opposite end of the block. A second block of memory cells identical in architecture to the first block of memory cells is laid out with mirror symmetry relative to an imaginary line perpendicular to the virtual ground lines and disposed at one end of the first block of memory cells. Contacts 18 with main bit line 12 and virtual ground lines 10 to the first block of memory cells are used in common with the mirror symmetrical second block of memory cells.

The plurality of memory cells 22 in the block is logically organized in columns. The columns of memory cells 22 are coupled together by diffusion bit lines 20, which cell 22 in this case is comprised of a single FET. Each column has two corresponding diffusion bit lines 20 disposed along the length of the block of memory cells 22. Memory cells 22 are arranged and configured into four columns with the center bit diffusion line 20' shared by the second and third columns of memory cells 22. Two virtual ground lines 10 are symmetrically disposed relative to the center diffusion bit line 20'. A first circuit 24 controlled by CA is disposed at one end of each block for selectively coupling the two diffusion bit lines 20 for the first column of memory cells together and two diffusion bit lines 20 for the fourth column of memory cells together. A second circuit 26 controlled by CB is disposed at the opposite end of each block for selectively coupling the center bit diffusion line 20' with the two adjacent bit diffusion lines 20.

As a result of the location of first and second circuits 24 and 26, the length of the circuit path of a signal read from any one of the addressed memory cells through bit diffusion lines 20 does not exceed in aggregate substantially more than one length of the memory block. Parasitic capacitance is avoided, memory access speed is increased, and the capacity for memory cell density is increased.

The general structural architecture of the memory core now having been reviewed, consider the detailed description of operation of the grounded memory core of the invention. As shown in the schematic in FIG. 2, main bit line 12 is coupled through core FETs 28 to a center bit line 20'. Two memory cells 22, for example particularly denoted by reference numeral 22(2), are coupled in series with each other in the memory core to form a pair. Other pairs of core FETs 22 are coupled in parallel between center line 20' to the outer diffusion bit lines 20 which are connected to virtual ground lines 10. The gates of memory cells 22 like cells 22(2) are coupled to respective word lines 14(1) through 14(n). Column select core FETs 26 are coupled in parallel with N memory cells on each side of center bit line 20'. Column select core FETs 24 are coupled in parallel with N memory cells which are connected to outer diffusion bit lines 20.

Figure 1:
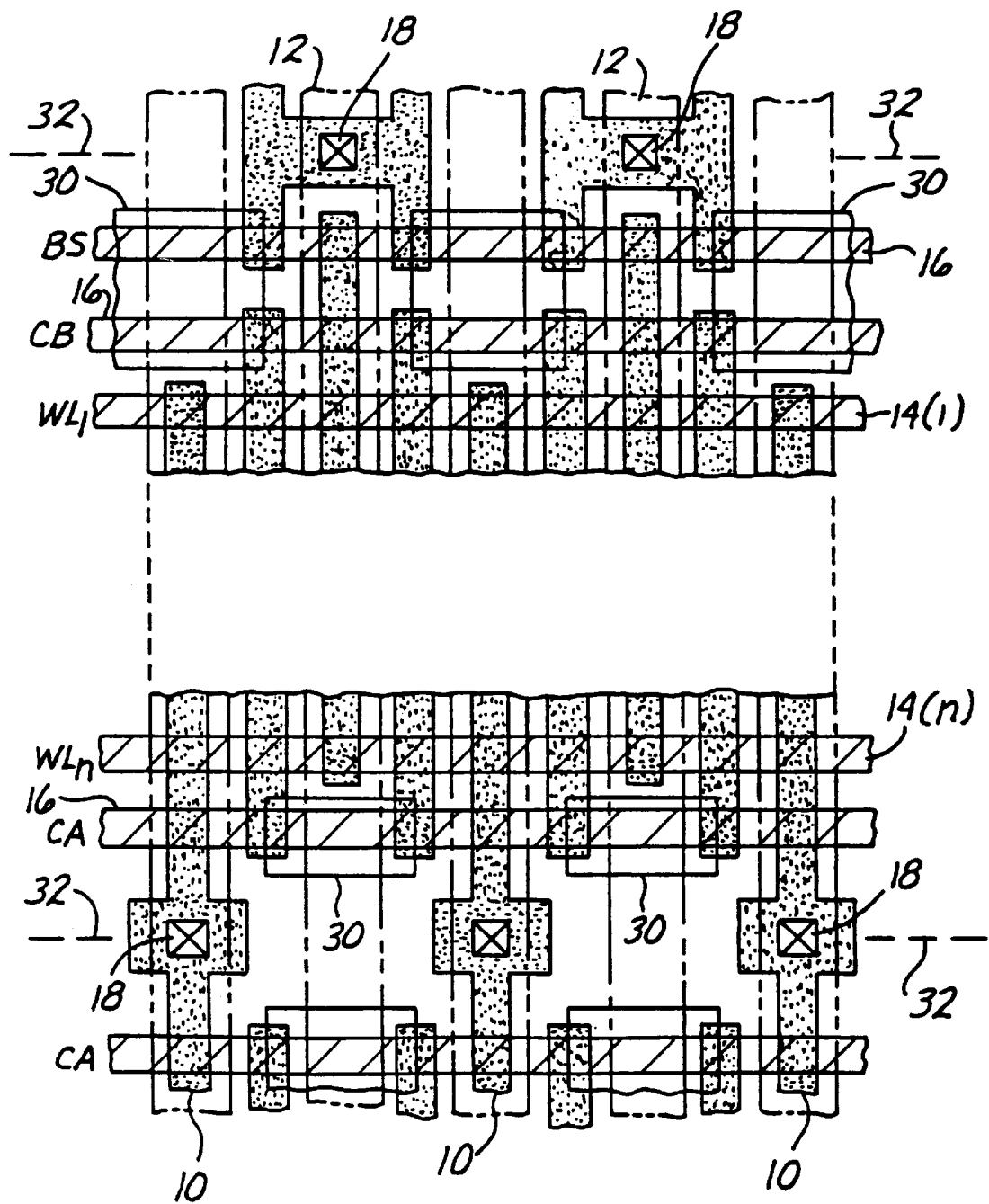
FIG. 1 is a plan view of a chip layout of a memory core operated according to the invention.

Bit lines 20 and 20' in FIG. 2, are n-type diffusion wires while main bit line 12 and virtual ground lines 10 are metal wires of aluminum. Referring to FIG. 1, word lines 14(1) through 14(n) and the column select signal lines 16, CA, CB, and BS, are polysilicon wires. The metallic contacts 18 are denoted by the squares containing an X. Regions 30 denote ion-implanted regions. Threshold voltages in ion-implanted regions 30 exceeds the supply voltage so that core FETs disposed in regions 30 are not turned on even if the gate voltage goes to a logic high.

Metal contacts 18 connecting the diffusion wiring to main bit line 12, and metal contacts 18 connecting the diffusion wiring to virtual ground lines 10 are positioned at opposite ends of the memory cell blocks as best depicted in FIG. 1. Therefore, the resistance of the diffusion wiring elements from main bit line contact 18 to a virtual ground line contact 18 remains constant regardless of the position of selected memory cell 22(2), because the resistance corresponds to the distance between metal contacts 18 for main bit line 12 and virtual ground lines 10. The memory layout is designed so that the memory cell blocks are mirror symmetrical about line 32 with respect to transverse or horizontal wires or lines (not shown) connecting contacts 18. As a result, the number of contacts 18 in the array is reduced by fifty percent as compared to conventional layout. As a further consequence, the capacitance and junction leakage current parasitics due to main bit line contacts 18 is reduced by fifty percent, thereby increasing switching speeds.

Consider the operation of the grounded memory core with a voltage sensing sense amplifier. Referring to FIG. 2, a column select signal, CA, is switched to a logic high level in order to select memory cells 22 in the second and third columns immediately adjacent to a main bit line 12 shown in the middle of the schematic in FIG. 2. Column select signal, CA, turns on transistors 24 to short each outer pair of diffusion bit lines 20 together in a pairwise fashion. Outermost diffusion bit lines 20 are connected to virtual ground lines 10, VGL1 and VGL2.

When column select signal, CB, is switched to a logic high level, it shorts the innermost diffusion bit lines 20 to center bit line 20' through transistors 26. This will select the first and fourth columns in the array of FIG. 2.

In other words, signal CA will select the second and third columns, while column select signal CB, will select the first and fourth columns, the columns being ordered and numbered from left to right in the array of FIG. 2. For proper addressing, only one of these two signals, CA or CB, is logically high at the same time.

All left block cells, denoted by dotted outline 34, are selected by switching the left virtual ground line 10 in FIG. 2 to a positive voltage level and holding the opposing or right virtual ground line 10 in FIG. 2 to the precharged ground level. In such an instance, the cells within block 34, as opposed to the symmetrically disposed block of memory cells 36, are read out while those in block 36 are not.

For the grounded memory core, the positive voltage level on a virtual ground line 10 is approximately two volts in amplitude at the end of the sensing phase. A bit-high level on the main bit line 12 is a positive voltage of approximately 150 millivolts in amplitude at the end of the sensing phase. A bit-line-low level is the precharge level of ground, or zero volts.

Figure 3:
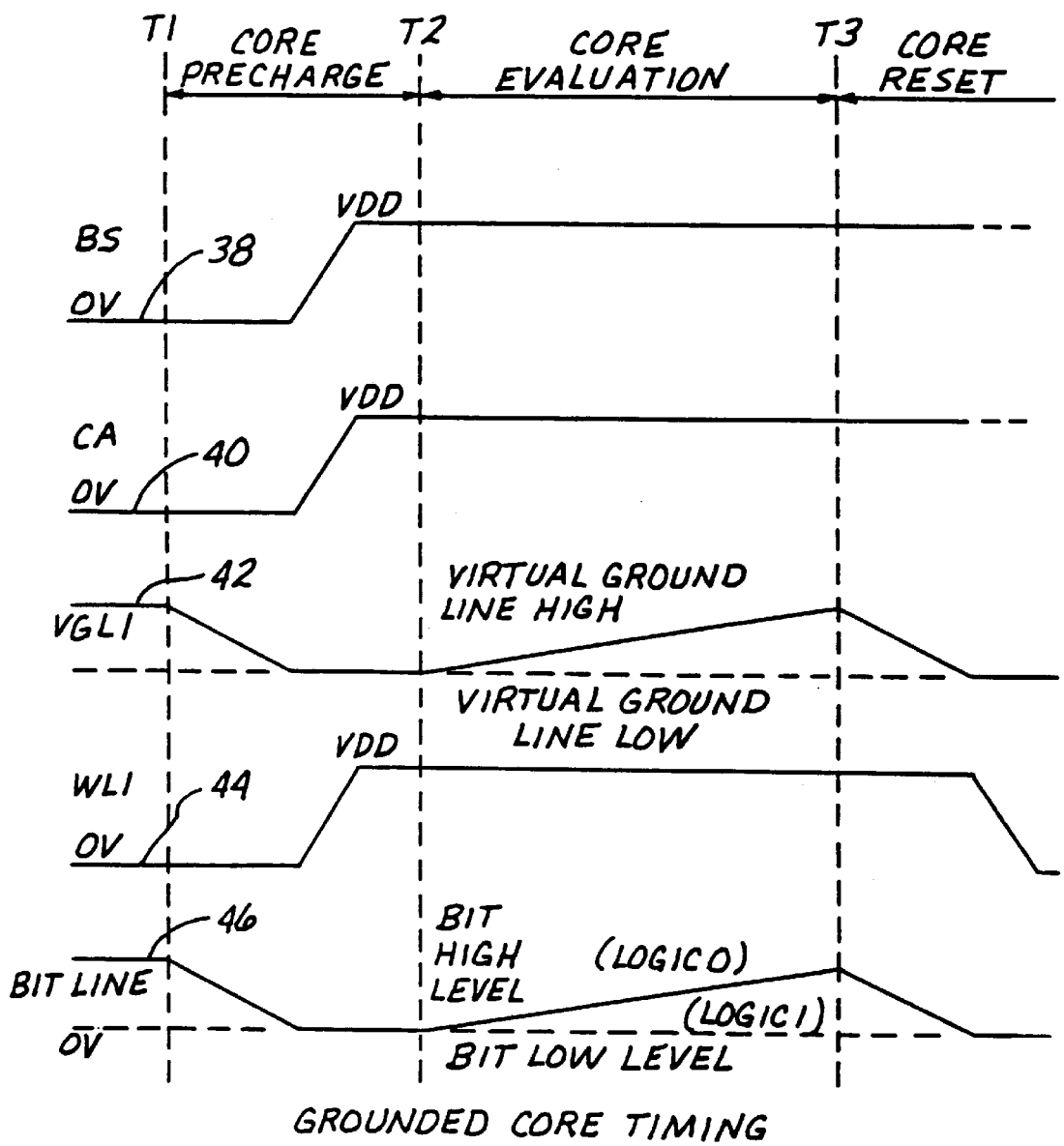
FIG. 3 is a timing diagram showing the waveforms of the control signals used to drive the memory core of FIGS. 1 and 2.

In order to select, for example, cell 22(2), block select signal, BS, line 16, goes to a logical high selecting the block shown in FIG. 2. See FIG. 3 for the signal wave forms for the example of selecting cell 22(2). The interval between T1 and T2 is the precharge cycle, between T2 and T3 the core evaluation cycle, and after T3 the core reset cycle. Signal BS, on line 16, is coupled to the gates of two transistors 28. When switched high as shown on line 38 in FIG. 3, BS couples main bit line 12 to center bit line 20' of the cell matrix block. Column select signal, CA, is a logical high as shown on line 40 in FIG. 3, and column select line, CB, is a logical low, thereby selecting the second and third columns. The leftmost virtual ground line 10 in FIG. 2, VGL1, goes after time T2 to a positive voltage as shown in FIG. 3. Rightmost virtual ground line 10 in FIG. 2, VGL2, is held at the precharged ground level thereby selecting the second column of cells and deselecting the third column of cells. Word line 14(1) switches to a logical high as shown on line 44 of FIG. 3 with each of the remaining word lines 14(2) to 14(n) to a logical low thereby reading cell 22(2) as shown on line 46 of FIG. 3.

Assume the selected core FET 22(2), is programmed with a low threshold voltage. The current transmission path through the block of memory cells begins with the leftmost virtual ground line 10 and ends with the main bit line 12, or mBL. The current flows from leftmost line 10 to the left outermost diffusion line 20 in FIG. 2. See line 42 of FIG. 3 for the voltage wave form on VGL1, or line 10. With core FET 24 controlled by CA, the current flows through FET 24 to the left innermost diffusion bit line 20. The current flows along left innermost line 20 to the drain of the selected core FET 22(2) and through core FET 22(2) to center diffusion bit line 20'. The current then flows through the two parallel core FETs 28 to the main bit line 12, or mBL The approximate voltage wave form on line 12, mBL, is shown on line 46 in FIG. 3.

The magnitude of the resultant voltage on the main bit line 12 varies significantly, and is largely dependent upon the programmed threshold voltages of core FETs 22(1), 22(3) and 22(4) in the same row of the core as the selected cell 22(2) in FIG. 2. These FETs have gates connected to WL1, line 14(1), and may also be turned on when FET 22(2) is selected. FIG. 4 shows the maximum voltage on the main bit line 12 as a function of the programmed threshold voltages of core FETs 22(1) through 22(4). There are eight combinations for the programmed threshold voltages of the three core FETs 22(1) through 22(4) as shown in FIG. 4. The right hand column shows the maximum main bit line voltage as a fraction of the virtual ground line voltage VGL1. VGL2, line 10, and diffusion line 20 are switched to ground by means of a virtual ground line decoder and driver circuit shown in FIGS. 9 and 10.

First consider the effect on the main bit line voltage level of core FET 22(1) having a low threshold voltage. The low threshold voltage is denoted as C in FIG. 4. Now there is a second current path from VGL1 to the drain of the selected core FET 22(2). The second path is along the outermost left diffusion line 20 through core FET 22(1). Since the resistance of both left diffusion lines 20 are equal, the resistance from the VGL1 line 10 to the drain of selected core FET 22(2) is reduced to one-half the resistance of a single path. As a result, the voltage on mBL, line 12, increases. Referring to FIG. 4, a comparison of combination 8 to combination 4, or combination 7 to combination 3, shows how much the programmed state of core FET 22(1) affects the maximum voltage on bit line 12.

The programmed threshold voltage of core FET 22(3) has the most pronounced effect on the main bit line voltage. If core FET 22(3) has a high threshold voltage, the current in FET 22(3) is approximately zero. There are no direct current paths from the center bit line 20' to ground, and the maximum main bit line voltage is equal to the voltage on VGL1, approximately two volts for the illustrated embodiment.

If core FET 22(3) is programmed with a low threshold voltage, a direct current path exists from the center diffusion bit line 20' to VGL2, line 10, by means of core FET 22(3), innermost right bit line 20, core FET 24, outermost right diffusion line 20, to line 10, VGL2. The resistance in this path from line 20' to VGL2 can be approximately equal to the resistance in the path from bit line 20' to VGL1 resulting in the voltage on line 20' being approximately one-half of the voltage applied to VGL1.

If both core FETs 22(3) and 22(4) are programmed to a low threshold voltage, the current from the source terminal of FET 22(3) can flow along innermost right bit line 20 and outermost right diffusion line 20 which reduces the resistance from the source terminal of FET 22(3) to VGL2, line 10, to one-half. The effect of the programmed threshold voltage of FET 22(4) on the main bit line 12 can be seen by comparing combinations 3 and 4 or combinations 7 and 8 of FIG. 4.

The lowest voltage on main bit line 12, for a bit-high level occurs when core FET 22(1) is a high threshold voltage, and both core FETs 22(3) and 22(4) are low threshold voltages. This is shown by combination 4 in FIG. 4. For this case, the main bit line 12 voltage is a maximum of about 38% of the voltage on VGL2. The maximum voltages shown in FIG. 4 are the levels which could be reached if the core FET 22(2) is allowed a long time to charge the bit line capacitance to a maximum value. For the invention, the main bit line 12 peak voltage, for a bit-high level, is about 25% of the levels shown in FIG. 4. This is because the typical core evaluation time, or sensing time, does not provide time for main bit line 12 to charge to a higher voltage level. For example, for combination 4 in FIG. 4, the typical voltage on the main bit line 12 is 200 millivolts with VGL1 being about two volts. The ROM which uses the invention incorporates a sense amplifier which can detect a 150 millivolt bit-high level.

Now assume the selected core FET 22(2) is programmed with a high threshold voltage which is greater than the voltage applied to WL1. The only current flowing through FET 22(2) is a very low sub-threshold current which is negligible for bit line sensing. The current path from VGL1 to center bit line 20' is then open, which allows the center bit line 20' and main bit line 12 to remain a precharged ground voltage level, a bit-low level.

Further assume that both selected core FET 22(2) and core FET 22(3) are programmed with a high threshold voltage. Center bit line 20' is not coupled to either the innermost left or right bit lines 20 so it is floating at the precharged ground voltage, a bit-low level. The voltage on floating bit line 20', or main bit line 12, can be affected by junction leakage currents or capacitively coupled noise voltages. Only noise voltages or junction leakage currents, which can shift the floating main bit line positive, can adversely affect the sense amplifier's reading of a bit-low level. For this reason, core junction leakage current to the grounded substrate does not affect the bit line which is floating at ground. Also, capacitively coupled negative noise voltages from the turning off of the memory core precharge clocks does not adversely affect the bit-low voltage level of zero volts.

Further, for a bit-high level which is a small positive voltage on the bit line, the negative noise voltages and the core junction leakage currents from the diffusion bit lines to substrate have negligible effect. This is because the selected core FET 22(2), with a programmed low threshold voltage, supplies a current to center bit line 20' which is orders of magnitude greater than the combined negative noise current and the core junction leakage from diffusion bit line 20'.

In summary, the memory core as defined in FIG. 2 can be used in the grounded core operating mode defined by the current invention with:
  a) a voltage sensing sense amplifier;
  b) a virtual ground line decoder circuit which selects both virtual ground lines 10, VGL1 and VGL2;
  c) a virtual ground line driver circuit to drive both of the two selected metal virtual ground lines. During the precharge phase, both of the two selected metal virtual ground lines are driven to ground, then, during the sensing phase, one of the two metal virtual ground lines is held at ground and the other of the two metal virtual ground lines is switched to a voltage source; and
  d) a precharge circuit to drive all metal virtual ground lines and metal bit lines to ground during the precharge phase. During the sensing phase, the precharge circuit is turned off.

Consider now the operation of the grounded memory core with a current sensing sense amplifier. The memory core shown in FIG. 2 can be used with other types of sense amplifiers than voltage sensing as described above. For example, a current sensing amplifier can be used. This type of sense amplifier supplies a sensing current through a bit line decoder to the main bit line 12.

The operation of the word lines and column select lines is the same as described above. The operation of the virtual ground lines is essentially reversed from that described above for a voltage sensing amplifier. This is due to the fact that the selected core FET must switch the sensing current to ground, if the selected core FET is programmed with a low threshold voltage. If the selected core FET is programmed with a high threshold voltage, the sensing current must be allowed to charge the selected main bit line to a positive voltage by opening the sensing current path to ground.

In order to select, for example, cell 22(2), block select signal, BS, line 16, goes to a logical high thereby selecting the block shown in FIG. 2. Signal BS, on line 16, is coupled to the gates of the two transistors 28. When switched high, BS couples main bit line 12 to a center bit line 20' of the cell matrix block. Column select signal, CA, is a logical high, and column select line, CB, is a logical low thereby selecting the second and third columns. Left virtual ground line 10, VGL1, is switched to ground. Right virtual ground line 10, VGL2, could be allowed to float at the precharged ground level, or, for the preferred embodiment, it is driven to a small positive voltage having an amplitude which will minimize any current flowing in unselected core FETs 22(3) and 22(4), thereby allowing the sensing current to more rapidly charge the main bit line to improve memory speed. The virtual ground lines VGL1 and VGL2 have thus selected the second column of cells and have deselected the third column of cells. Word line 14(1) switches to a logical high with each of the remaining word lines 14(2) to 14(n) to a logical low thereby reading cell 22(2).

Assume the selected core FET 22(2) is programmed with a low threshold voltage. The sensing current transmission path through the block of memory cells begins with the main bit line 12, mBL, and ends with left virtual ground line 10. With core FETs 28 controlled by BS, the sensing current flows from the main bit line 12 through FETs 28 to diffusion bit line 20'. The current then flows along line 20' to the drain of the selected core FET 22(2) and through core FET 22(2) to the left innermost diffusion bit line 20. With core FET 24 controlled by CA, which is switched to a logical high, the current flows along left innermost line 20, through FET 24, and to left outermost diffusion bit line 20 which is connected to virtual ground line VGL1. As a result of the sensing current flowing through the low resistance path, the voltage on mBL, line 12, is held to the a low level. This bit line voltage is defined herein as the bit-low level voltage.

The magnitude of the resistance in the sensing current path from the main bit line 12 to the left virtual ground line 10 varies significantly, depending upon the programmed threshold voltage of core FET 22(1) in FIG. 2. This FET has the gate connected to WL1, line 14(1), and may also be turned on when FET 22(2) is selected.

Consider the effect, on the bit-low voltage level, of core FET 22(1) having a low threshold voltage. Now there is a second current path from VGL1 to the drain of the selected core FET 22(2). The second path is along the outermost left diffusion line 20 through core FET 22(1). Since the resistance of innermost and outermost left diffusion lines 20 are equal the resistance from the VGL1 line 10 to the drain of selected core FET 22(2) is reduced to one-half the resistance of a single path. As a result of the sensing current flowing through the low resistance paths, the bit line low voltage, on mBL, line 12, is held to the lowest level for any combination of programmed threshold voltages of the core FETs shown in FIG. 2.

Now assume the selected core FET 22(2) is programmed with a high threshold voltage which is greater than the voltage applied to WL1. The only current flowing through FET 22(2) is a very low sub-threshold current which is negligible for bit line sensing. The sensing current path from center bit line 20' to VGL1 is then open, which allows the center bit line 20' and the main bit line 12 to be charged by the sensing current to a higher voltage level herein defined as a bit-high level voltage.

The programmed threshold voltage of core FET 22(3), FIG. 2, has an effect on the main bit line voltage for a short time after the sensing current is switched to the main bit line 12. If core FET 22(3) has a high threshold voltage, the current in FET 22(3) is approximately zero. There are no direct current paths from the center bit line 20' to VGL2, line 114. The sensing current can therefore charge diffusion bit line 20' to the sensing voltage level, a bit-low level or a bit-high level, in less time.

If core FET 22(3) is programmed with a low threshold voltage, an undesirable current path exists from the center diffusion bit line 20' to VGL2, line 10, by means of core FET 22(3), innermost right bit line 20, core FET 24, outermost right diffusion line 20, to line 10, VGL2. The resistance in this path from line 20' to VGL2 can be approximately equal to the resistance in the path from line 20' to VGL1. If VGL2 were floating at the precharged ground voltage level, approximately one-half of the sensing current would flow in this undesirable path for a significantly long time until the virtual ground line VGL2 was charged to a small positive voltage. The diffusion junction capacitance on the virtual ground line VGL2 is very high, since it is connected to all the memory cell blocks, typically 16, 32, or 64, in a column of the memory array. Because of the high capacitance on the virtual ground lines, the current sensing time is significantly long if, for this example, VGL2 is initially floating at the ground voltage level.

The current invention solves the problem of high capacitance virtual ground lines by using a virtual ground line decoder circuit which selects both virtual ground lines, VGL1 and VGL2, and a virtual ground line driver circuit which selectively drives one virtual ground line, VGL1, to ground and the second virtual ground line, VGL2, to a small positive voltage having an amplitude, approximately equal to the bit-low level voltage, which will minimize the undesirable current flowing in unselected core FET 22(3), thereby allowing the sensing current to more rapidly charge the main bit line to improve memory speed.

The voltage on the main bit line 12, mBL, is only slightly affected by junction leakage currents or capacitively coupled noise voltages. Capacitively coupled negative noise voltages or junction leakage currents which can shift the main bit line negatively can adversely affect the current sensing sense amplifier's reading of a bit-high level. The magnitude of the sensing current is typically much higher than these currents. For this reason, core junction leakage current to the grounded substrate and capacitively coupled negative noise voltages from the turning off of the memory core precharge clocks have little effect on the bit-high level voltage.

In summary, the memory core as defined in FIG. 2 can be used in the grounded core operating mode with:
 a) a current sensing sense amplifier;
 b) a virtual ground line decoder circuit which selects both virtual ground lines VGL1 and VGL2; and
 c) a virtual ground line driver circuit which selectively drives one virtual ground line to ground and the second virtual ground line to a small positive voltage level approximately equal to the bit line low level defined herein.

Differential Sense Amplifier

A circuit which differentially amplifies voltages that are close to ground with differences of about 0.15 volts uses voltage level shifters, a cross coupled current source and inverters to provide increased speed, accuracy, and gain.

Symmetric cross coupled current sources are used in a differential amplifier to provide the differential amplifier with a balanced load. A symmetric and balanced layout senses smaller voltage differences and operates faster than would otherwise be possible. The gain of the cross coupled current source is controlled by four FETs.

Voltage level shifters at the input to the differential amplifier allow the differential amplifier to sense signals that are close to ground with a voltage difference of about 0.15 volts. The voltage level shifters also shift the signals to a voltage that increases the gain of the differential amplifier.

Two inverters block half level signals from being outputted until the sense amplifier data has been latched. By blocking half level outputs of the differential amplifier, a race condition is eliminated and output enable signal, OE, may then switch sooner than would otherwise be possible.

Figure 6:
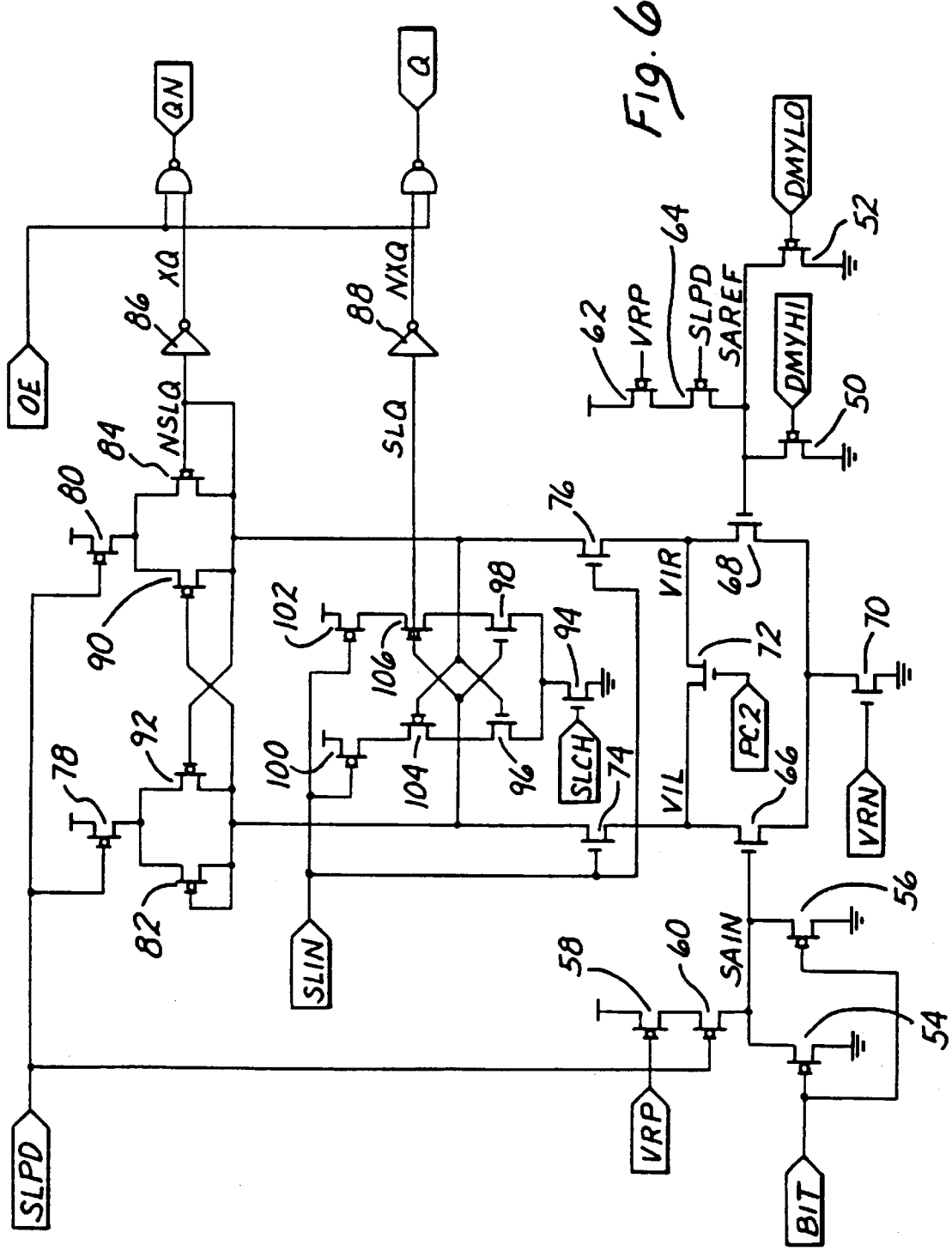
FIG. 6 is a schematic of the sense amplifier of the invention.

Consider first the architecture of the sense amplifier of FIG. 6. Referring to FIG. 6, DMYHI and DMYLO are connected to gates of FET 50 and 52 respectively. DMYLO is a dummy bit line in the ROM core with ROM cells programmed to prevent DMYLO from charging during a read cycle. DMYLO is precharged to ground. DMYLO has coupled noise voltages that are similar to those of a BIT line and the DMYHI line. It is used as a low voltage reference for all the sense amplifier circuits and the TRIG circuit. DMYHI is similar to DMYLO except the ROM cells on DMYHI are programmed to charge DMYHI from ground to a voltage level of about 0.15 volts. DMYHI is used as a BIT high voltage reference. BIT is the signal that carries the information from the memory core to the sense amplifier. Each BIT signal goes to a sense amplifier circuit. ROMs typically have more than one BIT and sense amplifier. ROMs with 8 or 16 BIT lines are common.

DMYHI serves as a BIT high voltage reference and DMYLO serves as a BIT low voltage reference. Because FETs 50 and 52 are connected in parallel the effective reference voltage is a level between the DMYLO and DMYHI levels. BIT is connected to the gates of both FETs 54 and 56.

The sense amplifier has two level shifting circuits. These circuits shift the low voltage inputs up to a voltage that the differential amplifier can easily sense. FETs 54–60 form one level shifting circuit and FETs 50, 52, 62 and 64 form the other level shifting circuit. The outputs from these level shifting circuits are the signals, SAIN and SAREF. SAIN and SAREF are inputs to the differential amplifier. By selectively changing some of the widths of FETs 54–60 and FETs 50, 52, 62 and 64, a wide range of voltages may be selected. A voltage that is optimal for the sense amplifier operation can thus be selected.

The differential amplifier is composed of FETs 66–84. The differential amplifier compares the voltage of SAIN and SAREF. FETs 78–84 comprise a pair of cross coupled current sources that provides increased gain for the differential amplifier circuit. Inverters 86 and 88 block half level outputs of the differential amplifier until these outputs have been latched.

The operation of the sense amplifier of FIG. 6 is described in four phases. They are:

(a) precharging to ground the ROM core, DMYLO, DMYHI, and all of the BIT lines;

(b) sensing the ROM core to charge DMYHI and, depending upon the programmed data, the BIT line;

(c) latching the data; and (d) automatically powering down the sense amplifier and retaining the latched data.

Consider the first phase of precharging the ROM core, DMYLO, DMYHI and BIT. Near the beginning of a ROM cycle, the precharge clocks, PC1 and PC2, are either high from the end of the previous cycle, or they are switched high to precharge the ROM to ground. PC1 is a precharge clock signal. PC1 precharges to ground all the virtual ground and bit lines in the core before and after core evaluation. PC2 is a precharge clock signal and precharges to ground BIT, DMYLO and DMYHI before and after memory core evaluation.

The time duration of the precharge is controlled by two circuits in the ROM called DCOK and OWDN (not shown). BIT is precharged to ground by PC2 switching high. DMYLO and DMYHI are also precharged to ground by PC2 switching high.

Referring to FIG. 6, FET 72 is turned on by PC2. Since FETs 74 and 76 are turned on by SLIN, nodes SLQ and NSLQ are equalized to the same voltage level while PC2 is high by means of FETs 72–76. SLQ and NSLQ are the outputs of the differential amplifier comprised of FETs 66–76 in FIG. 6 and are both input to and output of the latch circuit comprised of FETs 94–102. After the latching operation, SLQ and NSLQ are VDD/GND level signals representing the latched data. SLQ and NSLQ are inverted by inverters 86 and 88 to produce XQ and NXQ. XQ and NXQ connect to the output driver circuitry.

SLIN is high during memory core precharge to ground and while sensing the BIT, DMYLO and DMYHI inputs. When the data is latched by SLCH, SLIN switches low to disconnect the memory core and decode from the sense amplifier circuit. SLCH is a signal which is low during memory core precharge to ground and sensing, and is switched high to latch the data defined by the voltage levels on node SLQ and NSLQ at the start of the latch operation.

As long as the PC2 clock is high, output nodes SLQ and NSLQ remain at the equalized voltage level and do not respond to inputs BIT, DMYLO and DMYHI. PC2 is held high until the inputs BIT, DMYLO, and DMYHI are free of noise and/or have reached the appropriate voltage levels for sensing. By this means, outputs SLQ and NSLQ are preset to equal voltage levels from which they can respond quickly to the input signals.

Consider now the sensing the ROM core. Upon completion of the ROM core precharging, PC1 and PC2 are sequentially switched low. Address decoding is completed during the precharge phase to select (1) the sector of the ROM core to be sensed, (2) the word line within the sector, and (3) the bit and virtual ground lines within the sector. After PC1 is switched low, selected virtual ground lines are switched high by control signals, SELV0 or SELV1 shown in FIGS. 11a and 11b. DMYHI then starts charging relatively slowly toward about 0.15 volt while DMYLO remains low at ground. All BIT lines, connected from the memory core to all the sense amplifier circuits, will either charge up like DMYHI, or remain at about the DMYLO voltage level, depending upon how the selected ROM cells are programmed.

Consider in particular the sensing operation when BIT remains at the DMYLO level. At the start of the sensing phase, DMYLO, DMYHI, and BIT are at the ground voltage level, namely the BIT gates of FETs 54 and 56, DMYHI gate of FET 50 and DMYHI gate of FET 52. BIT remains at zero volts. SAIN and SAREF are at the same voltage level of about 2.2 volts. The source of FETs 66 and 68 is node Vs which is coupled to ground through FET 70. FET 70 has its gate controlled by VRN. VRN is an internal reference voltage for the differential amplifier current source, FET 70, used in the sense amplifier circuit.

The gates of FETs 66 and 68 start out at a balanced voltage. As DMYHI ramps relatively slowly upward to about 0.15 volts, the conductance of FET 50 becomes less, SAREF is driven higher, and SAIN remains at the same voltage level. As SAREF is driven higher, the conductivity of FET 68 increases and NSLQ is driven to a lower voltage level than SLQ.

Consider the sensing operation when BIT charges like DMYHI. At the start of the sensing phase, DMYLO, DMYHI, and BIT are at the ground voltage level, namely BIT gates of FETs 54 and 56, DMYHI gate of FET 50 and DMYHI gates of FET 52. SAIN and SAREF are at the same voltage level of about 2.2 volts. Both BIT and DMYHI then ramp relatively slowly from the initial ground level to about 0.15 volts. As DMYHI ramps up slowly, the conductance of FET 50 becomes less and SAREF is driven higher. At the same time BIT ramps up slowly, the parallel conductance of FETs 54 and 56 becomes less and SAIN is driven higher. Because BIT gates are the two FETs 54 and 56 and DMYHI gate is only one FET 50, SAIN is driven high at a faster rate than SAREF. The gates of FETs 66 and 68 start out at a balanced voltage. As SAIN is driven higher at a faster rate than SAREF, the conductivity of FET 66 increases faster than the conductivity of FET 68 and SLQ is driven to a lower voltage level than NSLQ.

Figure 5:
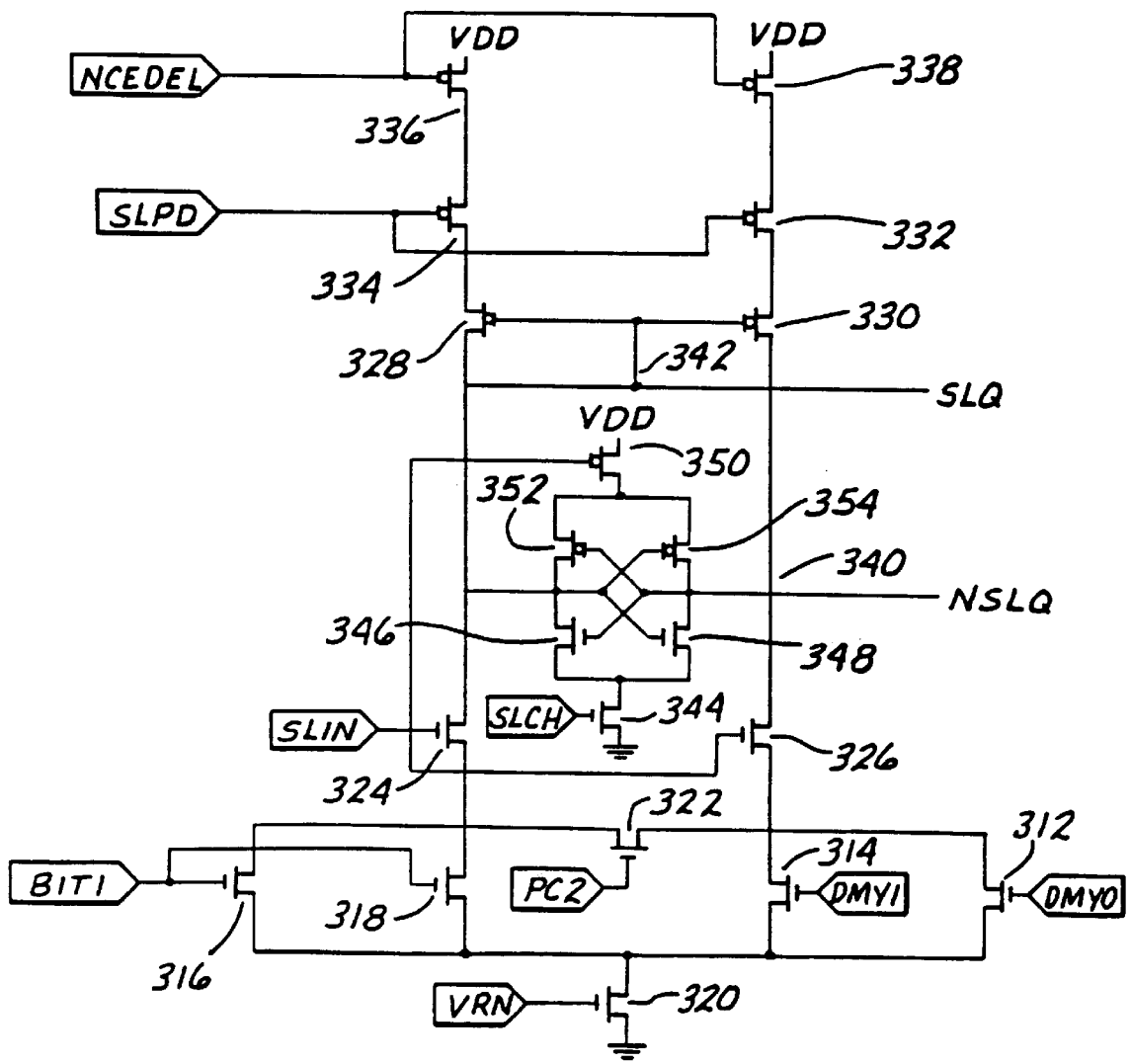
FIG. 5 is a schematic of a sense amplifier used in the parent application.

By selectively varying the gate widths of FETs 50–64, the level shifting circuit can shift the voltages SAIN and SAREF over a wide range of different values. The widths are ratioed so that the differential amplifier operates with input voltage levels providing maximum gain. This setting of voltages improves the speed and accuracy of the differential amplifier. On the previous differential amplifier of FIG. 5, the input levels were set at the internal precharge voltage of the memory core and could not be optimized for the best sense amplifier performance.

The present design employs a cross coupled current source to provide two current sources for the differential amplifier. Initially these current sources are matched and have the same capacitive load and impedance. As NSLQ and SLQ change, so do the current sources so that gain is provided to NSLQ and SLQ. For example, if BIT changes like DMYLO, then SLQ will start to go higher than NSLQ. As SLQ starts to go higher then the conductance of FET 90 is reduced which helps NSLQ to go lower and increases the voltage difference between NSLQ and SLQ. In the case where NSLQ starts to go higher, the conductance of FET 92 is reduced which helps SLQ to go lower and increases the voltage difference between SLQ and NSLQ.

FETs 90 and 92 can by themselves provide too much gain. FETs 82 and 84 are used in parallel to control the gain of the cross coupled current source. As the width-to-length ratio (W/L ratio) is increased for FETs 82 and 84, the gain of the cross coupled current source is reduced. As the width to length ratio (W/L ratio) is increased for FETs 90 and 92, the gain of the amplifier is increased. The desired gain for the amplifier is determined and controlled by the channel dimensions of FETs 82, 84, 90, and 92.

Figure 7:
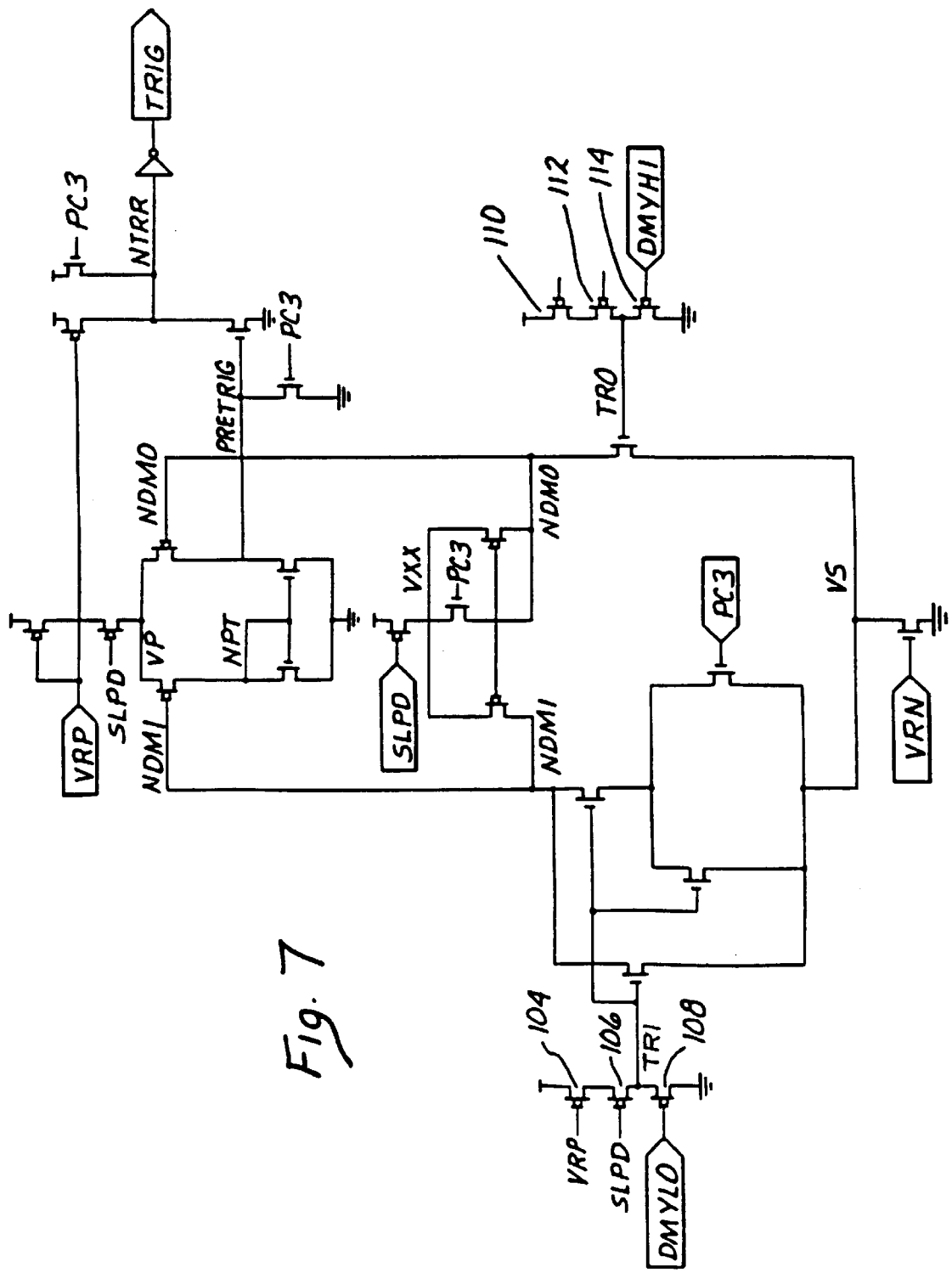
FIG. 7 is a schematic of a timing circuit that employs voltage level shifting circuits and a differential amplifier.
Figure 8:
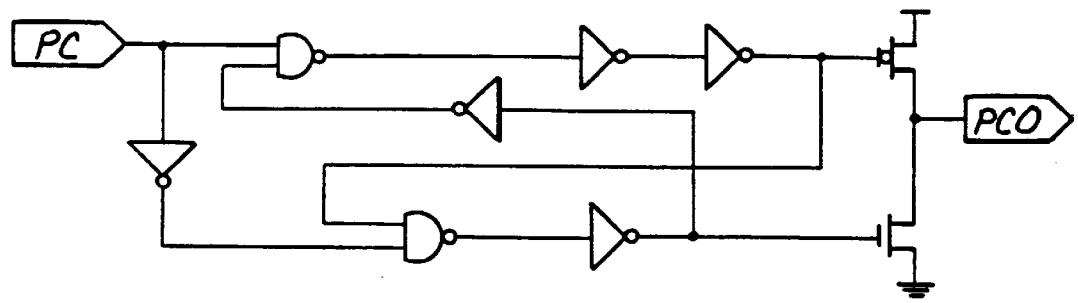
FIG. 8 is a schematic drawing of a previous interlock method to avoid crowbar current.

Consider now how the data is latched. The ROM has a circuit, herein called TRIG and shown in FIG. 7, which detects when DMYHI is about 0.15 volts above DMYLO. When this occurs, another conventional timing circuit (not shown), herein called SAMPCNTL, sequentially and quickly switches SLCH high, then SLIN low, and then SLPD high. SLPD is low during memory core precharge to ground, sensing and latching of the data, then switches high. The high level reduces the power dissipation of the sense amplifier to zero. The latched data is retained.

As SLCH switches high, FET 94 in FIG. 6 drives the source terminals of FETs 96 and 98 toward ground. In the case when BIT remains low like DMYLO, node SLQ is at a higher voltage level than NSLQ at this time, and FET 98 conducts more current than FET 96. FET 98 thus drives NSLQ toward ground faster than FET 96 drives SLQ, resulting in FET 96 being turned off, and NSLQ being driven low by FET 98.

Next, as SUN switches low, FETs 100 and 102 drive the source terminals of FETs 104 and 106 high. Since NSLQ is held low by FET 98, FET 104 conducts a higher current than FET 106. FET 104 then drives SLQ to VDD. Also, as SLIN switches low, FETs 74 and 76 are turned off which isolates the input FETs 66 and 68 from the latch circuit. This prevents the subsequent precharge of BIT, DMYLO, and DMYHI from affecting the latched data.

In the case when BIT charges high like DMYHI, NSLQ is initially at a higher voltage level than SLQ, and NSLQ will be higher than SLQ after the latch operation. Since the latch circuit comprised of FETs 94–102 is symmetrical the latching operation is reversed for the case when BIT is low as compared to the case when BIT is high as described above.

The design of the differential amplifier is optimized so that the voltage level of SLQ and NSLQ is above the trigger point of the inverters 86 and 88 during the sensing time. The outputs of the sense amplifier, XQ and NXQ, are therefore both low until the data starts to latch. Before the data starts to latch, neither NSLQ nor SLQ falls below the trigger point of the inverter. The outputs of the differential amplifier, NSLQ and SLQ, are latched by the time that one of these outputs falls below the trigger point of either output inverter 86 and 88. In this way, the inverters act to block half level outputs of the differential amplifier until data is latched.

In previous designs there existed a race condition between the output enable signal, OE, switching high and the outputs of the differential amplifier being latched. If OE switches high too soon, then incorrect data could be sent to the output drivers and this data may be outputted. OE can be delayed to ensure that OE does not switch high too soon, but this time would be added to the access time of the ROM. Since the inverters block half level outputs from the differential amplifier until the data is latched, the race condition does not exist and OE may switch high sooner than would otherwise be possible.

Finally consider the powering down of the sense amplifier. The sense amplifier automatically powers down at the end of a read cycle. When SLPD switches high at the end of a read cycle, FETs 78, 80, 60, and 64 are switched off. There is no current path through the voltage level shifters from VDD to ground. The latch circuit comprised of FETs 94–102 drives SLQ and NSLQ to VDD or ground depending upon the data latched. With SLIN low, and SLPD high, there is no current path from VDD to ground, so the power dissipation is zero for the remainder of the memory cycle.

The sense amplifier also operates in a stand by mode. In the stand by mode, power consuming circuits in the ROM are shut down to save power. NCE is switched high and SLPD switches high. Because SLPD switches high, FETs 336 and 338 in FIG. 5 from the previous sense amplifier design are not needed. Power down in the stand by mode is the same as automatic power down at the end of a read cycle.

As stated, voltage level shifters can be used to advantage in other circuits. The use of the voltage level shifters in other circuits is demonstrated in FIG. 7. In this case, the voltage level shifters are used with a differential amplifier to generate the signal, TRIG, in a timing circuit used in the ROM. DMYLO and DMYHI are reference voltages that are close to ground with a voltage difference of about 0.15 volts. FETs 104–108 and 110–114 are two voltage level shifters. The outputs of these voltage level shifters are TR0 and TR1. TR0 and TR1 are inputs to a differential amplifier that is used as a timing circuit. When the voltage difference between DMYLO and DMYHI becomes large enough, the differential amplifier detects this difference and TRIG switches from low to high. Voltage level shifting circuits may thus be used with conventional CMOS differential amplifiers.

Virtual Ground and Bit Line Decoder

A CMOS virtual ground and bit line decoder multiplexes a selected main bit line and two virtual ground lines. The CMOS decoder provides an improved precharge to the memory core as compared to NMOS decoders, because the decoder is designed for use with a memory core that is precharged to ground.

In the present design an additional decode is done by means of the SELV lines. Because this additional decode is done by means of the SELV lines, the present decoder uses fewer FETs and less area than would otherwise be possible.

An improved interlock method is provided in a circuit which is inherently faster and uses less silicon die area because fewer gates are used. Crowbar current is normally not significant but can become very significant when large FETs are used. This interlock method avoids these crowbar currents.

Figure 9:
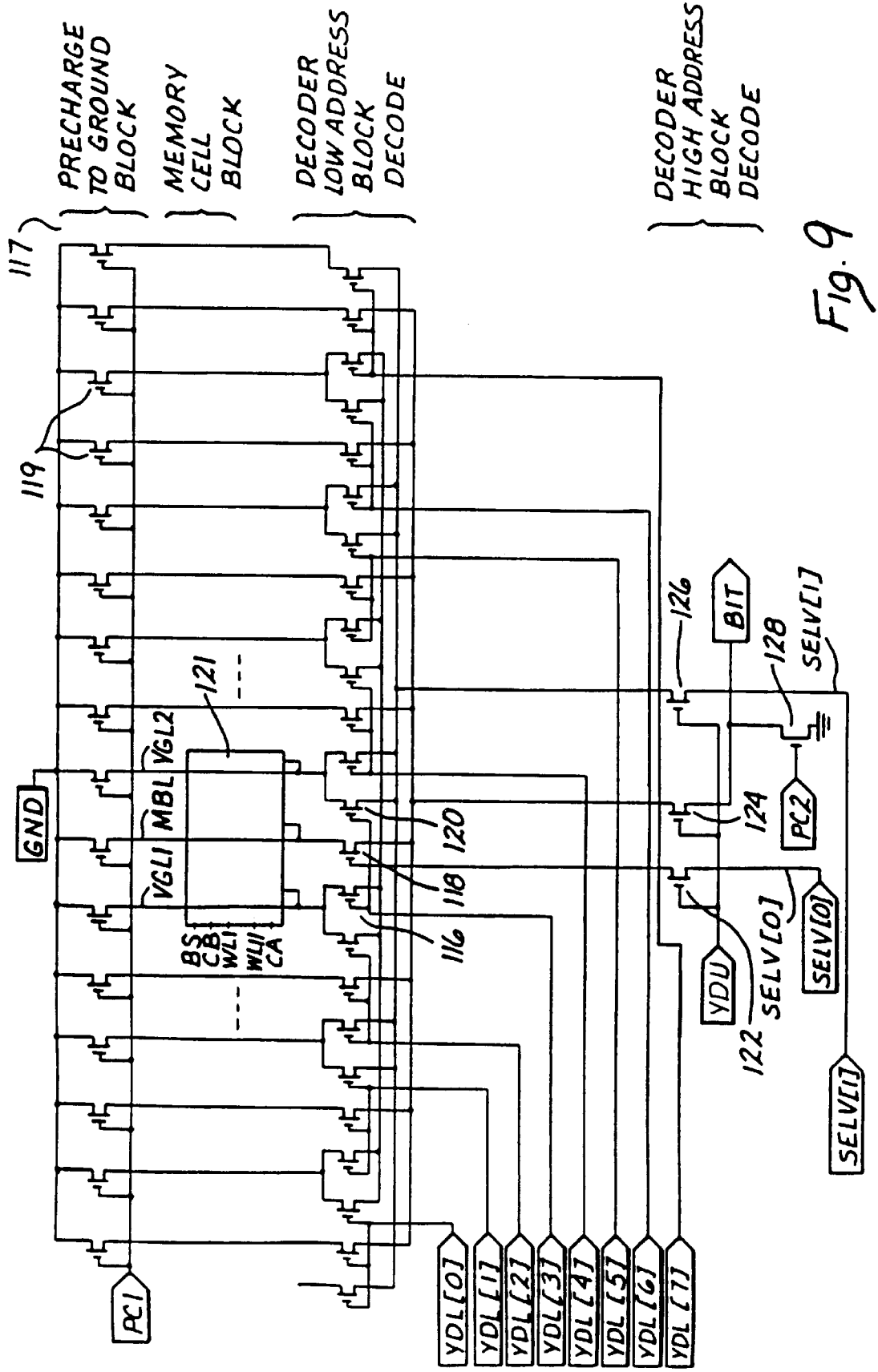
FIG. 9 is a schematic of the virtual ground and bit line decoder circuit of the invention.

Consider first the architecture of the virtual ground and bit line decoder circuit. The virtual ground and bit line decoder circuit functions as a multiplexer. FIG. 9 shows a simplified schematic of how this function is implemented. In FIG. 9, SELV0 and SELV1 are mapped into many virtual ground lines in the core and one of many main bit lines from the core is mapped to the BIT line. The lines carrying the signals, SELV0 and SELV1, are collectively known as the SELV lines. SELV0 is a control signal from one of two voltage sources for the virtual ground lines. The present design has two virtual ground voltage sources. Both voltage sources are initially low, then one voltage source goes high while the other voltage source stays low. The voltage source that goes high is determined by an address decode. SELV1 is a control signal from the other one of the two voltage sources for the virtual ground lines. AY[4] is the address that determines whether SELV0 or SELV1 will go high during a read cycle. If AY[4] is low, then SELV0 will go high. If AY[4] is high, then SELV1 will go high. The signal, mBL, refers to the main bit line of the ROM. The main bit line is the selected bit line through which the selected core FET can output data. Data from the memory core is read through the main bit line.

The multiplexer has two sets of addresses as shown in FIG. 9. YDL[0] through YDL[7] are decoded lower addresses. YDU is a decoded upper address. These address lines go to the gates of FETs that act as pass transistors. These pass transistors are connected in series. For example, YDL[3] goes to the gate of FETs 116–120 and YDU goes to the gate of FETs 122–126. FET 116 is in series with FET 122, FET 118 is in series with FET 124, and FET 120 is in series with FET 126. Several different multiplexing designs are compatible with the invention and the one chosen is illustrated not by way of limitation but only by example for the purposes of clarity. The design of the low address block is unique. For example, multiplexing methods with any number of pass gates connected in series may be used. The present design has two FETs in series but will also work without the high address block decoder or with two high address blocks connected in series.

FIG. 9 also shows a precharge-to-ground block 117. Block 117 is composed of a plurality of FETs 119, all of which are connected in parallel. Each FET 119 has a source connected to ground, a gate connected to PC1, and a drain connected to either a main bit line or a virtual ground line in the memory core. PC1 is a precharge clock signal. PC1 precharges to ground all the virtual ground and bit lines in the core before and after core evaluation. VGL is the virtual ground line. The core has many virtual ground lines, but only two are selected for each selected bit. One selected virtual ground line stays low. The other selected virtual ground line is low at the beginning of the cycle to help discharge the memory core and then switches high to act as a voltage source for the memory core. After core evaluation, this selected virtual ground line switches low again to help discharge the memory core for the start of the next core evaluation. All virtual ground lines are precharged to ground during core precharge. All unselected virtual ground lines are floating at ground during core evaluation.

Every main bit line and virtual ground line in the memory core is connected to a precharge FET in precharge-to-ground block 117. A memory core block 121 is also shown in FIG. 9. Block 121 is repeated in rows and in columns to form the memory array. A detailed drawing of memory block 121 is described in connection with FIGS. 1 and 2.

FIG. 9 further shows that the drain of FET 128 is connected to BIT, its source is connected to ground, and its gate is connected to PC2. When PC2 switches high, BIT is precharged to ground through FET 128. PC2 is a precharge clock. PC2 precharges to ground all BIT lines before and after core evaluation.

Figure 10:
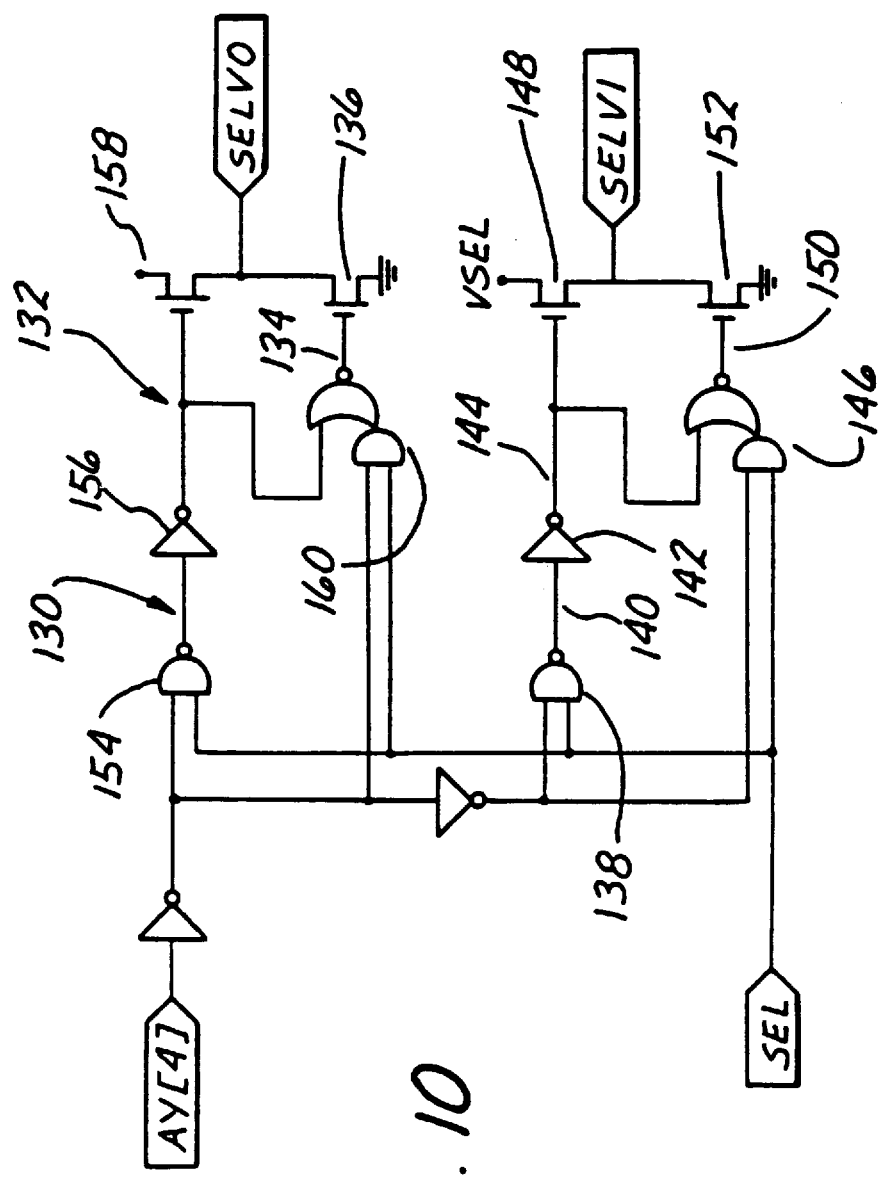
FIG. 10 is a schematic drawing of the interlock method to avoid crowbar current.

Consider now the circuit which generates the multiplexing control signals, SELV0 and SELV1. FIG. 10 shows the circuit that generates SELV0 and SELV1. Address AY[4] is inverted once and used to generate SELV0. Address AY[4] is inverted again to generate SELV1. This address enables one SELV line to go high during a read cycle and forces the other SELV line low. For example, if AY[4] is high then node 130 is high, node 132 is low, and node 134 is high. FET 136 will be on and SELV0 will be forced low.

Consider now how the interlock circuit of FIG. 10 avoids crowbar currents in a driver that must switch large capacitive loads. NAND gate 138 has the inputs SEL and AY[4] inverted twice. SEL is a memory control signal which controls the rising and falling edges of SELV0 and SELV1. When SEL goes high, SELV0 or SELV1 will rise. When SEL goes low, SELV0 and SELV1 will go low.

The output of NAND gate 138 is node 140. Node 140 is the input of inverter 142 whose output is node 144. Node 144 is an input to a complex gate 146. Gate 146 also has inputs SEL and AY[4] inverted twice. Node 144 gates FET 148 and node 150 gates FET 152. The drain of FET 148 is connected to VSEL. VSEL is a voltage source for the SELV lines. VSEL may be shorted to VDD or may be at a lower voltage. The source of FET 148 and the drain of FET 152 are connected together and form SELV1. The interlock circuit is repeated in FETs 136, and 154–160 to generate SELV0 as described above.

Crowbar currents may be very large when inverters and logic gates use large FETs. When CMOS inverters and logic gates switch, there is a period of time where both the PMOS and the NMOS FETs are partially turned on. The current that flows through these FETs is called crowbar current. Crowbar current is normally not significant, but can become very significant when large FETs are used. This interlock method avoids these crowbar currents. If this method, FETs 148 and 152 are very large FETs because they must drive a very large capacitive load. The interlock method was devised to ensure that FET 148 turns off before FET 152 turns on, and that FET 152 turns off before FET 148 turns on. In this method there can be no crowbar current through FETs 148 and 152 because one of these FETs will always be off when the other FET is on.

Figure 11A:
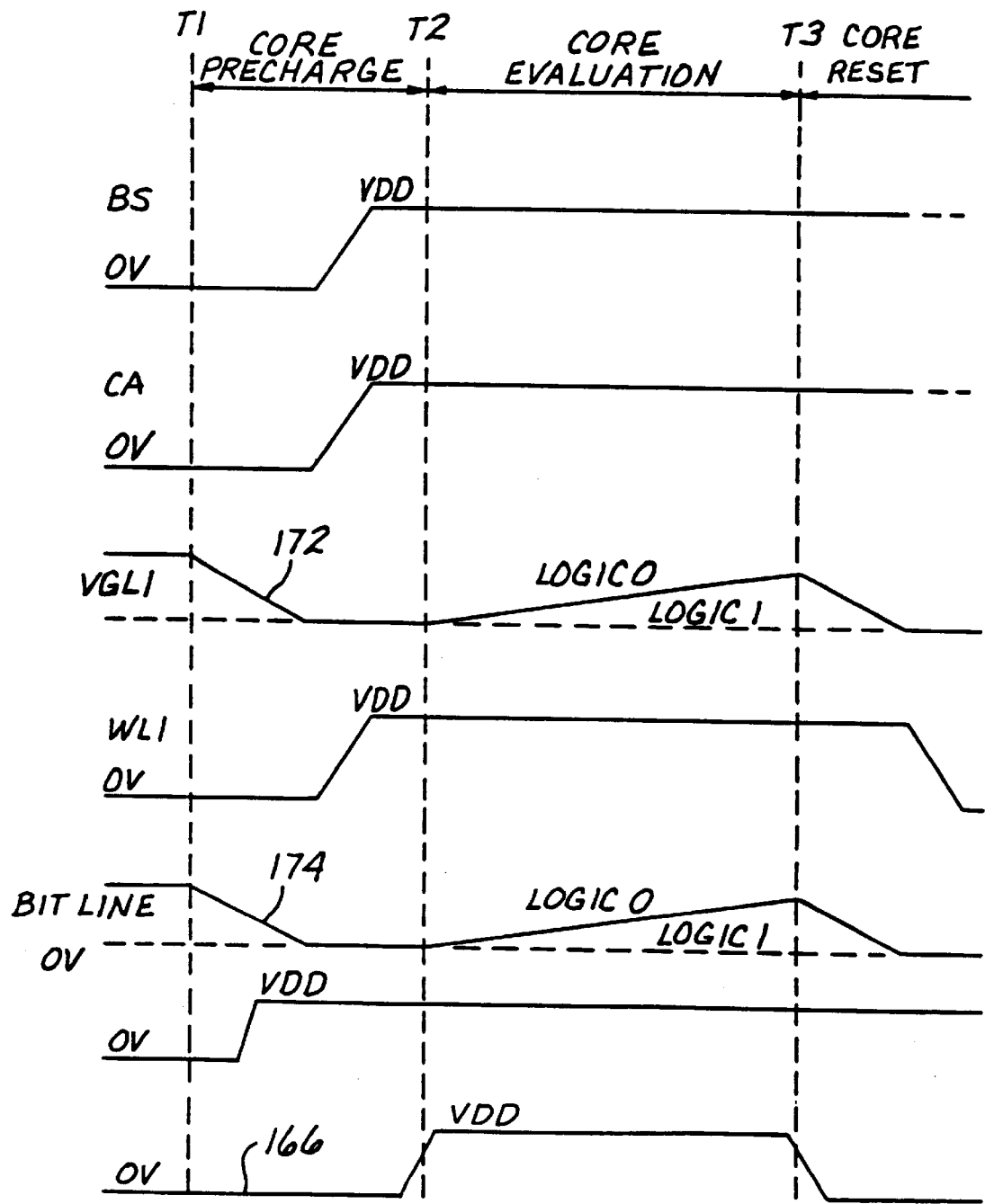
FIGS. 11a and b are a timing diagrams of the relevant decoder signals.
Figure 11B:
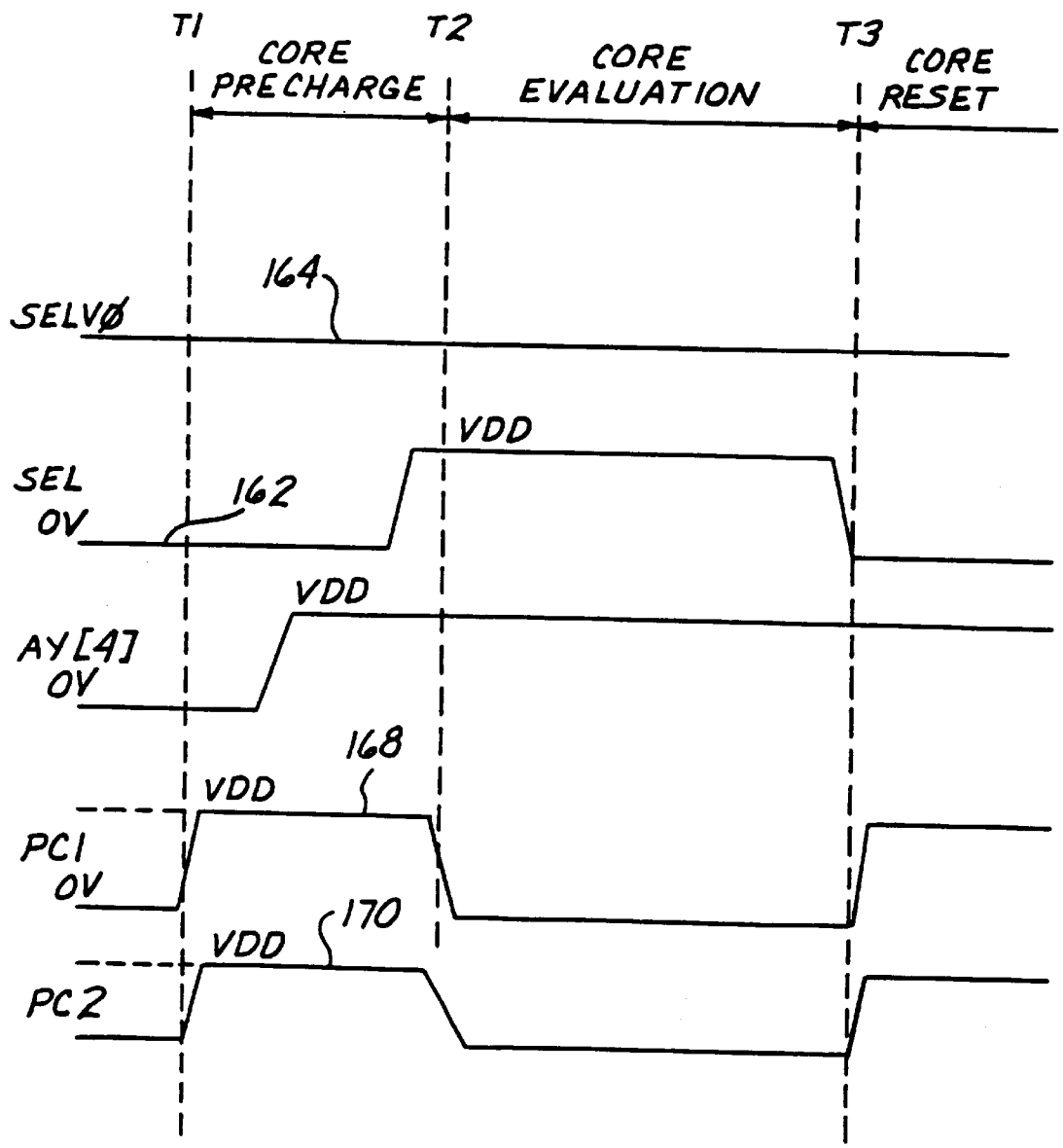

Consider the operation of the virtual line decoder circuit and bit line decoder circuit as improved in the invention. FIGS. 11a and b are timing diagrams of the virtual ground and bit line decoder operation. These timing diagrams are very similar to FIG. 3, but additional timing signals have been added which are relevant to the operation of the virtual ground and bit line decoder. The time between T1 and T2 is the memory core precharge time. The interval between T2 and T3 the core evaluation period, and the interval after T3 the core reset period. SEL is low on timing line 162 and both SELV0 and SELV1 are at ground on timing lines 164 and 166 respectively. It is at T1 that PC1 switches high on timing line 168 and the core is precharged to ground through precharge-to-ground block 117 as shown in FIG. 9. Thus, before the start of each read cycle, all the virtual ground line and main bit line of the memory core are driven to ground by means of the PC1 clock. The selected two virtual ground lines are additionally precharged to ground through another path in the decoder circuit. The upper and lower addresses are selected during the core precharge time and SELV0 and SELV1 are both driven to ground during the T1 to T2 interval. Thus there exists a precharge path to ground for the two selected virtual ground lines. For example, in FIG. 9, if YDL[3] and YDU switch high during the core precharge time, SELV0 and SELV1 are both low and VGL1 and VGL2 are precharged to ground through FET 116, FET 122, FET 120 and FET 126. PC2 switches high on timing line 170 as PC1 switches high on timing line 168. BIT is precharged to ground through FET 128.

After the core and the word line from the previous cycle have been adequately discharged, SEL switches high and then either SELV0 or SELV1 goes high. A FET in the ROM is selected by the appropriate combination of WL, BS, SELV0 or SELV1, and CA or CB line. The signal BIT on the main bit line will rise if the selected memory core FET is programmed with a low threshold level. The signal BIT on the main bit line will stay low if the selected memory core FET is programmed with a high threshold level.

Different paths through the memory core are selected by SELV0 and SELV1. If SELV0 goes high, then one path through the memory core is selected. If SELV1 goes high, then another path through the memory core is selected. The decoding of the two SELV lines is unique and necessary for proper addressing of the selected memory cell. By decoding an address in the two SELV lines, the virtual ground line decoder is made simpler, less FETs are needed and the silicon die area of the circuitry is reduced.

By controlling the voltage of VSEL we can control the voltage level of the SELV lines. The SELV lines have the highest voltage in the memory core. High voltages in the memory core can cause the FETs of the memory core to breakdown because of the very small dimensions of these FETs. By controlling the voltage level of VSEL, FET breakdowns in the memory core can be avoided.

At the end of the read cycle at time T3, the selected SELV line, SELV1 for example on timing line 166, is forced low as quickly as possible by SEL going low on timing line 162. By forcing the selected SELV line low, the selected virtual ground line is quickly precharged to ground and made ready for the next read cycle during core reset as shown on timing line 172. If the selected main bit line has been driven high during the previous read cycle, then there exists a path from the virtual ground lines to the main bit line. Switching the virtual ground lines low will therefore discharge the main bit line through the same path which charged the main bit line high as shown on timing line 174. This is the case where it is important to discharge the main bit line. In the other case where there is no current path from the virtual ground lines to the main bit line, the main bit line has not risen and does not need this extra precharging to ground also shown on timing line 174.

Proper operation of the interlock method requires that the two large output FETs 148 and 152 must never both be on at the same time. To ensure this condition, node 144 must be low before node 150 starts to switch high, and node 150 must be low before node 144 starts to switch high.

Figure 12:
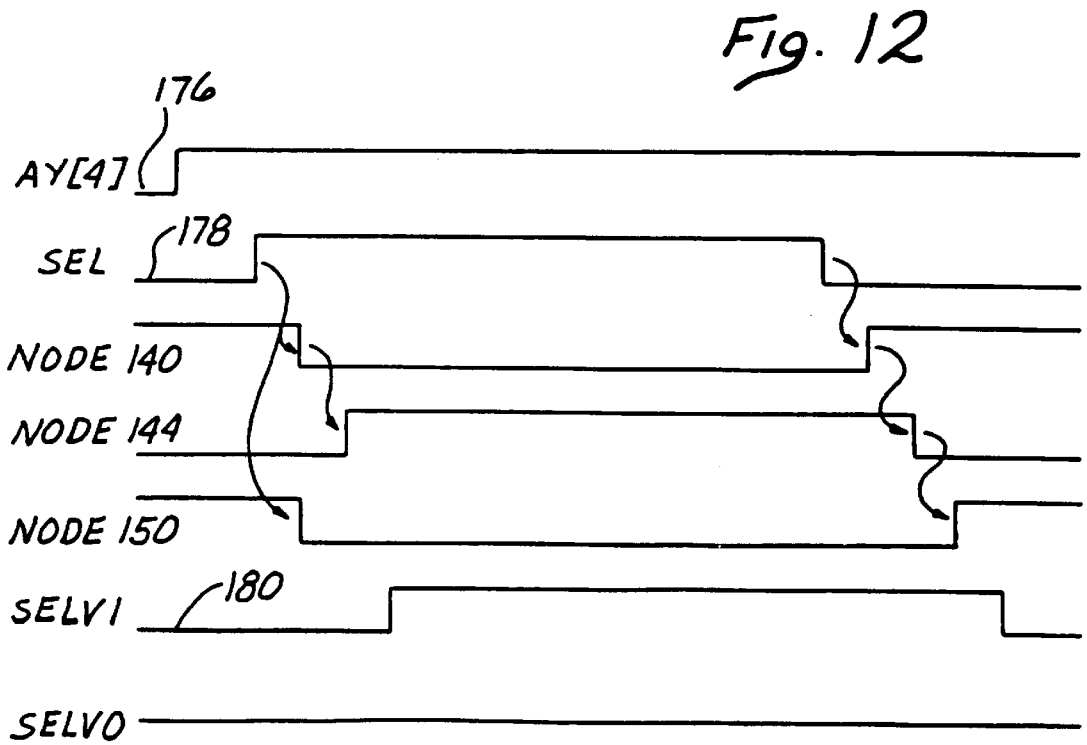
FIG. 12 is a timing diagram showing the function of the interlock method.

FIG. 12 shows a timing diagram of the interlock circuit. Signal AY[4] switches first on timing line 176 and later SEL goes high on timing line 178. If AY[4] is high, then node 140 switches low, node 144 switches high, and FET 148 drives SELV1 high as shown on timing line 180 after SEL switches high on timing line 178. If AY[4] is low, then node 130 switches low, node 132 switches high, and FET 158 drives SELV0 high after SEL switches high.

Assume that AY[4] switches high. When SEL switches high, there are two timing paths to consider. In one path, node 140 switches low, node 144 switches high, and FET 148 turns on. In the other path, node 150 switches low and FET 152 turns off. The path that turns FET 152 off has fewer stages than the path that turns FET 148 on. Because the path that turns FET 152 off has fewer stages, this path is faster than the path that turns FET 148 on. FET 152 is sufficiently turned off before FET 148 turns on so that crowbar current is negligible.

When SEL switches low at the end of a cycle, there is only one timing path to consider. Node 140 switches high, node 144 switches low, and node 150 switches high. Because node 144 switches low before node 150 switches high, FET 148 is sufficiently turned off before FET 152 turns on so that crowbar current is negligible.

Many alterations and modifications may be made by those having ordinary skill in the art without departing from the spirit and scope of the invention.

Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the essential idea of the invention.

We claim:

1. An improvement in a method for decoding a plurality of virtual ground lines and bit lines in a memory core comprising the steps of:

driving all virtual ground lines in said memory core low;

multiplexing two virtual ground lines in a memory core, by holding a selected first virtual ground line low and keeping a selected second virtual ground line low for memory core discharge; and by driving said selected second virtual ground line high for core evaluation;

evaluating said memory core;

keeping all unselected virtual ground lines floating during said step of evaluating said memory core; and switching said second virtual ground line low for memory core discharge in preparation for subsequent memory core evaluation.

2. The improvement of claim 1 further comprising the step of precharging a BIT line to ground prior to said step of evaluating said core, said BIT line being selectively coupled to said bit lines in said memory.

3. A decoder for producing two memory multiplexing signals, SELV0 and SELV1, capable of driving a large capacitive memory load, said decoder coupled between a high voltage supply and around and comprising:

decode means for selectively decoding an address signal to drive one of said two memory multiplexing signals, SELV0 and SELV1, high and the other low; and drive means coupled to said decode means and for generating said two memory multiplexing signals, SELV0 and SELV1, in response to said decode means, said drive means being tristated, without generating any current between said high voltage supply and ground when switching between said low and high logic levels of SELV0 and SELV1, whereby noise to ground is reduced.

4. The decoder of claim 3 wherein said drive means is comprised of a pair of two large FETs coupled in series, said memory multiplexing signals, SELV0 and SELV1, being derived respectively from said coupling between one of said pair of said two large FETs, said drive means comprising means for turning each one of said two large FETs off before turning on the other one of said two large FETs in each of said pairs of FETs, so that one of said FETs of each pair will always be off when the other one of said pair of FETs is on.

5. The decoder of claim 3 wherein said memory multiplexing signals, SELV0 and SELV1, have a voltage level set by said high voltage supply at a decoder supply voltage, VSEL, said memory multiplexing signals, SELV0 and SELV1, having the highest voltage level in said memory core, wherein voltage levels of said memory multiplexing signals, SELV0 and SELV1, are set at a level low enough to avoid memory breakdowns in said memory core.

6. A method for producing two memory multiplexing signals, SELV0 and SELV1, capable of driving a large capacitive memory load comprising the steps of:

selectively decoding an address signal to determine which one of said two memory multiplexing signals, SELV0 and SELV1, is to be driven high and the other to be driven low; and generating said two memory multiplexing signals, SELV0 and SELV1, as tristated signals, without generating any crowbar current when switching between said low and high logic levels of SELV0 and SELV1, whereby noise to ground is reduced.

7. The method of claim 6 wherein said step of generating comprises the step of controlling one FET in a pair of two large FETs coupled in series, said memory multiplexing signals, SELV0 and SELV1, being derived respectively from said coupling between one of said pair of said two large FETs, said step of controlling comprises the steps of turning each one of said two large FETs off before turning on the other one of said two large FETs in each of said pairs of FETs, so that one of said FETs of each pair will always be off when the other one of said pair of FETs is on.

8. The method of claim 7 further comprising the step of setting the voltage levels of said memory multiplexing signals, SELV0 and SELV1, by a decoder supply voltage, VSEL, said memory multiplexing signals, SELV0 and SELV1, having the highest voltage level in said memory core, wherein voltage levels of said memory multiplexing signals, SELV0 and SELV1, are set at a level low enough to avoid memory breakdowns in said memory core.

9. A driver circuit for driving a large capacitve load while avoiding crowbar currents comprising:

two large FETs coupled in series, an output signal being derived from said coupling between said two large FETs; and means for turning each one of said two large FETs off before turning on the other one of said two large FETs, so that one of said FETs will always be off when the other one of said FETs is on so that no crowbar current is generated as said two large FETs are switched, whereby noise to around is reduced.

* * * * *